US010203163B2

(12) United States Patent
Fujii

(10) Patent No.: US 10,203,163 B2
(45) Date of Patent: Feb. 12, 2019

(54) COOLING SYSTEM AND ELECTRONIC DEVICE

(71) Applicant: NEC Platforms, Ltd., Kawasaki-shi, Kanagawa (JP)

(72) Inventor: Shunsuke Fujii, Kanagawa (JP)

(73) Assignee: NEC PLATFORMS, LTD, Kanagawa (JP)

( * ) Notice: Subject to any disclaimer, the term of this patent is extended or adjusted under 35 U.S.C. 154(b) by 0 days.

(21) Appl. No.: 15/513,245

(22) PCT Filed: Oct. 14, 2015

(86) PCT No.: PCT/JP2015/005203
§ 371 (c)(1),
(2) Date: Mar. 22, 2017

(87) PCT Pub. No.: WO2016/059799
PCT Pub. Date: Apr. 21, 2016

(65) Prior Publication Data
US 2017/0311481 A1    Oct. 26, 2017

(30) Foreign Application Priority Data

Oct. 17, 2014  (JP) ................................. 2014-212153

(51) Int. Cl.
*F28D 15/02* (2006.01)
*H05K 7/20* (2006.01)
(52) U.S. Cl.
CPC ..... *F28D 15/0266* (2013.01); *H05K 7/20309* (2013.01); *H05K 7/20818* (2013.01); *H01L 2924/0002* (2013.01)
(58) Field of Classification Search
CPC ........ H05K 7/20809–7/20818; H05K 7/20645
See application file for complete search history.

(56) References Cited

U.S. PATENT DOCUMENTS 6,924,981 B2 * 8/2005 Chu ................... H05K 7/20754
165/104.33
7,385,810 B2 * 6/2008 Chu ..................... H05K 7/2079
165/104.33
(Continued)

FOREIGN PATENT DOCUMENTS

JP  S57-010997 B2   3/1982
JP  S58-038719 B2   8/1983
(Continued)

OTHER PUBLICATIONS

International Search Report for PCT Application No. PCT/JP2015/005203, dated Dec. 15, 2015.
(Continued)

*Primary Examiner* — Robert J Hoffberg

(57) ABSTRACT

The purpose of the present invention is to more efficiently cool exhaust heat, of an apparatus or the like that emits heat, by preventing a situation where a gas-phase medium is cooled and turns into a liquid-phase medium and thereby transfer of the gas-phase medium is hindered. For this purpose, a cooling system includes a heat receiving means for receiving a gas heated by heat emitted by an electronic apparatus and changing a liquid-phase heat medium into a gas-phase heat medium. a heat radiation means for cooling the gas-phase heat medium so as to be changed into the liquid-phase heat medium. a first transfer means for transferring the gas-phase heat medium from the heat receiving means to the heat radiation means. and a second transfer means for transferring the liquid-phase heat medium from the heat radiation means to the heat receiving means. wherein at least part of the first transfer means is heated by the heat emitted by the electronic apparatus.

10 Claims, 21 Drawing Sheets

(56) References Cited

U.S. PATENT DOCUMENTS

| | | | | |
|---|---|---|---|---|
| 7,477,514 B2* | 1/2009 | Campbell | .......... | H05K 7/20745 |
| | | | | 165/80.4 |
| 7,990,709 B2* | 8/2011 | Campbell | .......... | H05K 7/20745 |
| | | | | 165/104.33 |
| 8,077,462 B2* | 12/2011 | Barringer | .......... | H05K 7/20781 |
| | | | | 138/110 |
| 8,113,009 B2* | 2/2012 | Kuriyama | .......... | H05K 7/20745 |
| | | | | 361/696 |
| 8,760,863 B2* | 6/2014 | Campbell | .......... | H05K 7/20709 |
| | | | | 361/600 |
| 8,797,740 B2* | 8/2014 | Campbell | .......... | H05K 7/20709 |
| | | | | 29/592.1 |
| 8,804,334 B2* | 8/2014 | Eckberg | ............ | H05K 7/2079 |
| | | | | 165/104.33 |
| 8,817,465 B2* | 8/2014 | Campbell | .......... | H05K 7/20709 |
| | | | | 361/600 |
| 8,817,474 B2* | 8/2014 | Campbell | .......... | H05K 7/20709 |
| | | | | 361/689 |
| 8,947,879 B2* | 2/2015 | Broome | ............ | H05K 7/1497 |
| | | | | 165/104.33 |
| 9,167,721 B2* | 10/2015 | Campbell | .......... | H05K 7/20281 |
| 9,314,886 B2* | 4/2016 | Eckberg | ............... | B23P 15/26 |
| 9,321,136 B2* | 4/2016 | Eckberg | ............ | H05K 7/2079 |
| 9,474,186 B2* | 10/2016 | Campbell | .......... | H05K 7/20281 |
| 9,492,899 B2* | 11/2016 | Eckberg | ............ | H05K 7/2079 |
| 9,507,393 B2* | 11/2016 | Alshinnawi | ........ | H05K 7/20781 |
| 9,727,101 B2* | 8/2017 | Yoshikawa | ........ | H05K 7/20818 |
| 2012/0291465 A1 | 11/2012 | Kashirajima et al. | | |
| 2014/0360696 A1* | 12/2014 | Alshinnawi | ........ | H05K 7/20781 |
| | | | | 165/11.1 |
| 2015/0145391 A1* | 5/2015 | Broome | ............... | H05K 7/1497 |
| | | | | 312/236 |
| 2016/0282023 A1* | 9/2016 | Matsunaga | ............. | F28D 15/06 |

FOREIGN PATENT DOCUMENTS

| | | |
|---|---|---|
| JP | H03-260593 A | 11/1991 |
| JP | 2001-349681 | 12/2001 |
| JP | 2002-340489 A | 11/2002 |
| JP | 2009-134541 | 6/2009 |
| JP | 2012-243035 A | 12/2012 |
| WO | 2014/087636 A1 | 6/2014 |

OTHER PUBLICATIONS

English translation of Written opinion for PCT Application No. PCT/JP2015/005203.

* cited by examiner

Fig. 2
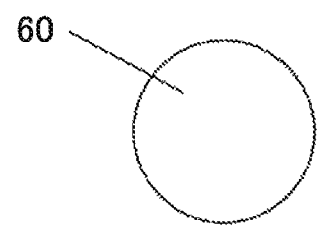
60
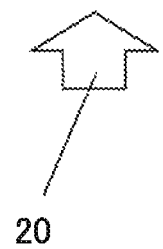
20

COOLING SYSTEM AND ELECTRONIC DEVICE

This application is a National Stage Entry of PCT/JP2015/005203 filed on Oct. 14, 2015, which claims priority from Japanese Patent Application 2014-212153 filed on Oct. 17, 2014, the contents of all of which are incorporated herein by reference, in their entirety.

TECHNICAL FIELD

The present invention relates to a technology to cool an apparatus generating heat and in particular, relates to a cooling system and an electronic device.

BACKGROUND ART

As a method for cooling an apparatus generating heat such as a server or the like, a method described in patent literature 1 is known. This method is based on a principle in which in heat receiving means, a phase of heat medium is changed from a liquid phase to a gas phase (hereinafter, the heat medium whose phase is a liquid phase is referred to as a "liquid phase medium" and the heat medium whose phase is a gas phase is referred to as a "gas phase medium"), the apparatus is cooled by using vaporization heat, the gasified heat medium is changed into the liquid phase heat medium at the outside of the apparatus or the like, and whereby, heat is discharged.

Further, in patent literature 2, a loop-type heat pipe including a heater for heating a vapor pipe is disclosed.

Further, in relation to the present invention, in patent literature 3, there is disclosed a cooling system for cooling an electronic apparatus which includes an evaporator for evaporating refrigerant by using the heat generated by the electronic apparatus, a blower for feeding the air heated the heat generated by the electronic apparatus into the evaporator, and a condenser, disposed at a position higher than that of the evaporator, for cooling and condensing the refrigerant to be supplied to the evaporator.

CITATION LIST

Patent Literature

[PTL 1] International Publication No. 2014/087636
[PTL 2] Japanese Patent Application Laid-Open No. 2002-340489
[PTL 3] Japanese Patent Application Laid-Open No. 2012-243035

SUMMARY OF INVENTION

Technical Problem

In the method described in patent literature 1, the heat receiving means change the liquid phase medium into the gas phase medium in which heat is stored and the heat stored in the gas phase medium is taken out at the outside of the apparatus or the like in which the heat receiving means are installed. Accordingly, it is necessary to transfer the gas phase medium to the outside of the apparatus or the like by a transfer pipe or the like. However, at the time of this transfer, a case in which the gas phase medium is cooled and changed into the liquid phase medium, the liquid phase medium adheres to the inside of the transfer pipe or the like or the liquid phase medium blocks the transfer pipe or the like, and whereby, the transfer of the gas phase medium is disturbed occurs. When the gas phase medium is not efficiently transferred, the exhaust heat cannot be effectively cooled.

Further, when the method described in the patent literature 2 is used, it is necessary to use a heater for heating the vapor pipe.

An object of the present invention is to solve the above-mentioned problem and to provide a cooling system which can more efficiently cool the exhaust heat of an apparatus or the like generating heat and an electronic device using the same.

Solution to Problem

The cooling system and the electronic device including the same include heat receiving means for receiving a gas warmed by heat generated by an electronic apparatus, changing a liquid phase heat medium into a gas phase heat medium, and thereby, storing heat in the heat medium. Further, the cooling system and the electronic device including the same include heat radiation means for cooling the gas phase heat medium and thereby, changing the gas phase heat medium into the liquid phase heat medium and first transfer means for transferring the gas phase heat medium from the heat receiving means to the heat radiation means. Further, the cooling system and the electronic device including the same include second transfer means for transferring the liquid phase heat medium from the heat radiation means to the heat receiving means and at least a part of the first transfer means is heated by using heat generated by the electronic apparatus.

Advantageous Effects of Invention

The occurrence probability of a case in which when the gas phase medium is transferred from the heat receiving means to the heat radiation means, the gas phase medium is cooled and changed into the liquid phase heat medium and whereby, the transfer of the gas phase medium is blocked decreases. For this reason, air or the like warmed by heat generated by an electronic apparatus can be efficiently cooled.

BRIEF DESCRIPTION OF DRAWINGS

FIG. 2 shows a conceptual cross-sectional view of a minimum configuration of the present invention.

DESCRIPTION OF EMBODIMENTS

An example embodiment of the present invention will be described in detail below.

Figure 1:
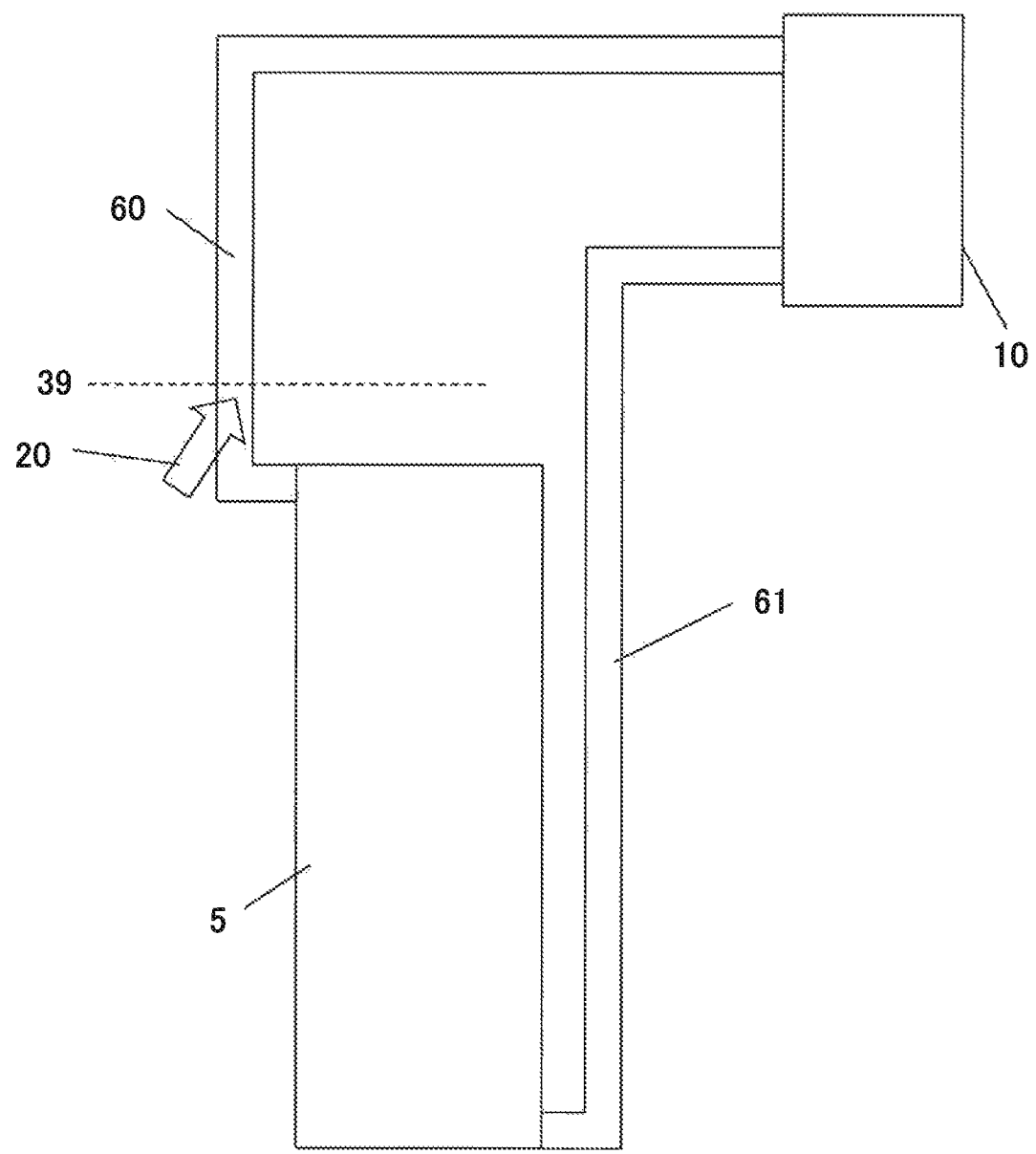
FIG. 1 shows a conceptual view of a minimum configuration of the present invention.

FIG. 1 and FIG. 2 show conceptual views of a minimum configuration of a cooling system of the present invention. FIG. 2 shows a conceptual cross-sectional view of first transfer means 60 along a dotted line indicating a first cutting position 39 in FIG. 1.

A minimally configured cooling system of the present invention includes heat receiving means 5, first transfer means 60, heat radiation means 10, and second transfer means 61. The heat receiving means 5 receives a gas (hereinafter, referred to as an "exhaust heat flow 20") heated by heat generated by an electronic apparatus (not shown here) (hereinafter, the electronic apparatus generating heat is merely referred to as the "electronic apparatus") and change the phase of the heat medium from the liquid phase to the gas phase. At this time, heat is stored in the gas phase medium. The first transfer means 60 transfers the gas phase medium transferred from the heat receiving means 5 to the heat radiation means 10. The heat radiation means 10 changes the gas phase medium transferred by the first transfer means 60 into the liquid phase medium by cooling the gas phase medium and thereby, radiate heat stored in the gas phase medium. The second transfer means 61 transfers the liquid phase medium from the heat radiation means 10 to the heat receiving means 5.

Here, as shown in FIG. 2, the exhaust heat flow 20 collides with at least a part of the first transfer means 60.

As a result, the occurrence probability of a case in which the inside of the first transfer means 60 is warmed, the gas phase medium is changed into the liquid phase medium by the cooling, and whereby the flow of the gas phase medium in the first transfer means 60 is blocked decreases. As a result, the gas phase medium more smoothly flows in the first transfer means 60. Accordingly, an amount of the liquid phase medium which is changed into the gas phase medium per unit time in the heat receiving means 5 increases and the cooling can be more efficiently performed in comparison with a case in which the exhaust heat flow 20 does not collide with the first transfer means 60.

Further, in FIG. 1 and FIG. 2, for ease of understanding, each component has a predetermined shape and is arranged in predetermined arrangement. However, the shape and arrangement can be arbitrarily determined. Further, in FIG. 2, the exhaust heat flow 20 collides with the first transfer means 60 at approximately right angle. However, the angle can be arbitrarily determined.

First Example Embodiment

A first example embodiment is an example embodiment of an electronic device in which a cooling system of the present invention and an electronic apparatus are installed in the same chassis 1.

Figure 3:
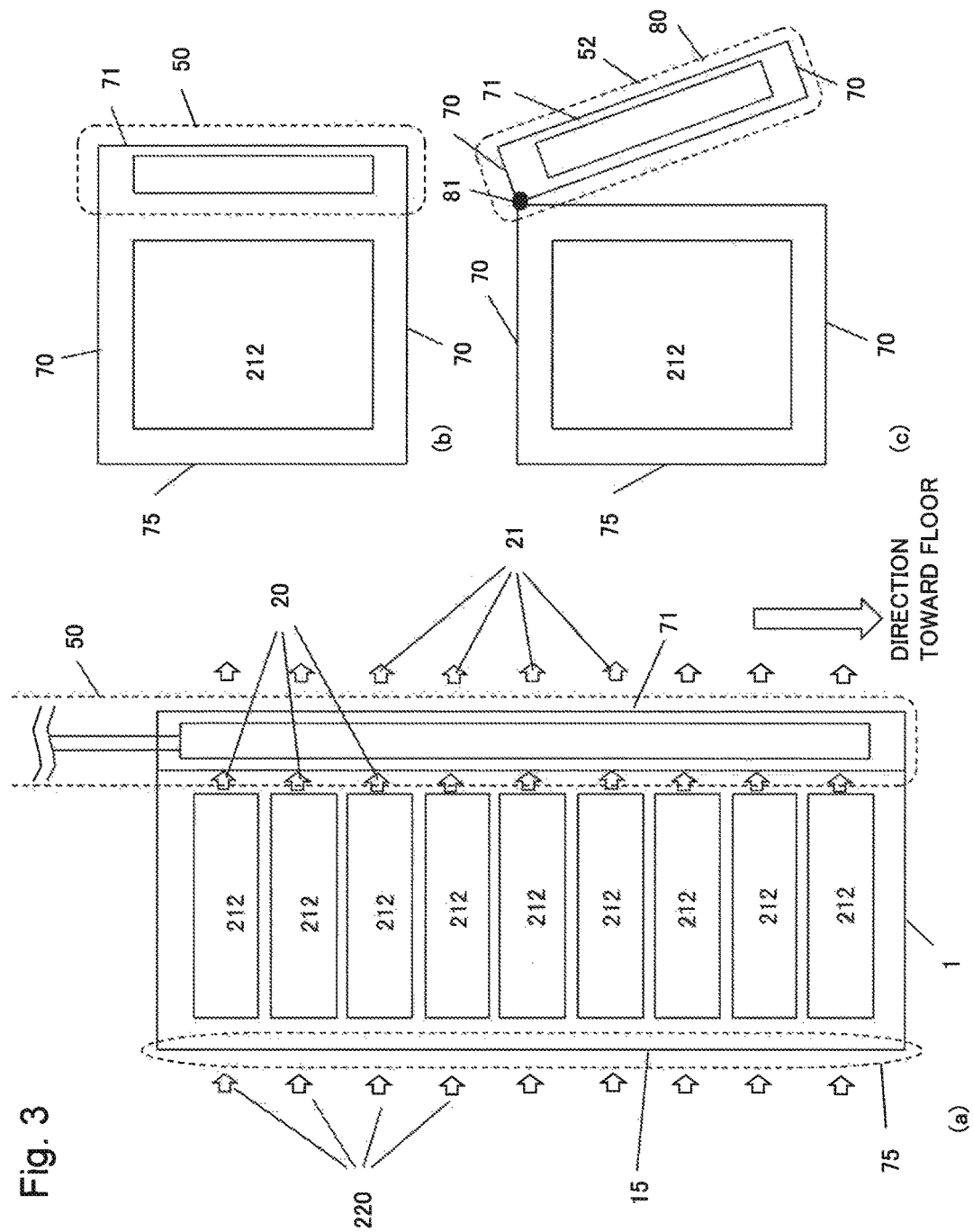
FIG. 3 shows conceptual views of a first electronic device according to a first example embodiment.

FIG. 3 shows a conceptual view of a first electronic device according to the first example embodiment. FIG. 3(a) is a side view. FIG. 3(b) and FIG. 3(c) are top views.

The first electronic device according to the first example embodiment includes the chassis 1, nine electronic apparatuses 212, and a cooling system 50.

In FIG. 3, nine electronic apparatuses 212 are shown. However the number of the electronic apparatuses 212 can be arbitrarily determined.

A ventilation wall 15 (a through-hole is provided thereon and whereby, air easily passes through the wall. Hereinafter the same will apply) is provided on a chassis front face 75. An air conditioner's airflow 220 generated by an air conditioner, an air blower, or the like (not shown here) that is installed in a room in which the first electronic device according to the first example embodiment is disposed collides with the chassis front face 75. The air conditioner's airflow 220 passes through the chassis front face 75, enters the inside of the chassis 1, and collides with the electronic apparatus 212. After the collision, the air conditioner's airflow 220 is warmed by heat generated by the electronic apparatus 212, passes through the electronic apparatus 212, and flows as the exhaust heat flow 20. The exhaust heat flow 20 collides with the heat receiving means 5 (not shown here) of the cooling system 50 and thereby is cooled. The cooled exhaust heat flow 20 that is called a cooling flow 21 is sent to the outside of the chassis 1 through a chassis rear face 71.

As the cooling system 50, a cooling system including the minimum configuration of the cooling system of the present invention can used and typically, the cooling system according to the second to fifth example embodiments can be used.

As the electronic apparatus 212, various electronic apparatuses can be used and typically, a server such as a blade server or the like can be used.

As the chassis 1, a 19 inch rack used for installing many electronic apparatuses such as a server, a network apparatus, and the like may be used. For example, a 19 inch rack conforming to JIS standard (Japanese Industrial Standards) or a 19 inch rack conforming to EIA standard (Electronic Industries Alliance standard) can be used. In this example embodiment, the 19 inch rack is used for the chassis 1. However, it is not limited to the 19 inch rack. Further, in the explanation of the example embodiment of the present application, a shape of the chassis 1 is substantially cuboid. However, the chassis 1 may have another shape.

Further, in the example embodiment in the specification of the present application, the words of "front face", "rear face", "side face", and the like are used for ease of understanding of the positional relation of these faces of the chassis 1. Therefore, these words merely mean that a face opposite to the front face is the rear face and the side face is adjacent to the front face and the rear face and have no more meaning other than this positional relation.

The component that has to be installed in the chassis 1 among the components of which the cooling system 50 is composed of can be mounted on an openable and closable chassis door 80 that is attached by a door hinge 81 to the chassis 1 and a cooling system 52 in which the component and the chassis door are integrated can be realized. This structure has an advantage in which both the electronic apparatus 212 and a part of the cooling system 50 mounted on the chassis door 80 can be easily maintained when the chassis door 80 is opened.

This first electronic device according to the first example embodiment has an advantage in which it is not necessary to install blowing means such as a fan or the like which consume an electric power and generate heat inside the chassis 1 or the number of the blowing means can be reduced. Therefore, when the sufficient air flow can be secured in the chassis 1 by the air conditioner's airflow 220, the cooling efficiency can be more improved.

Figure 4:
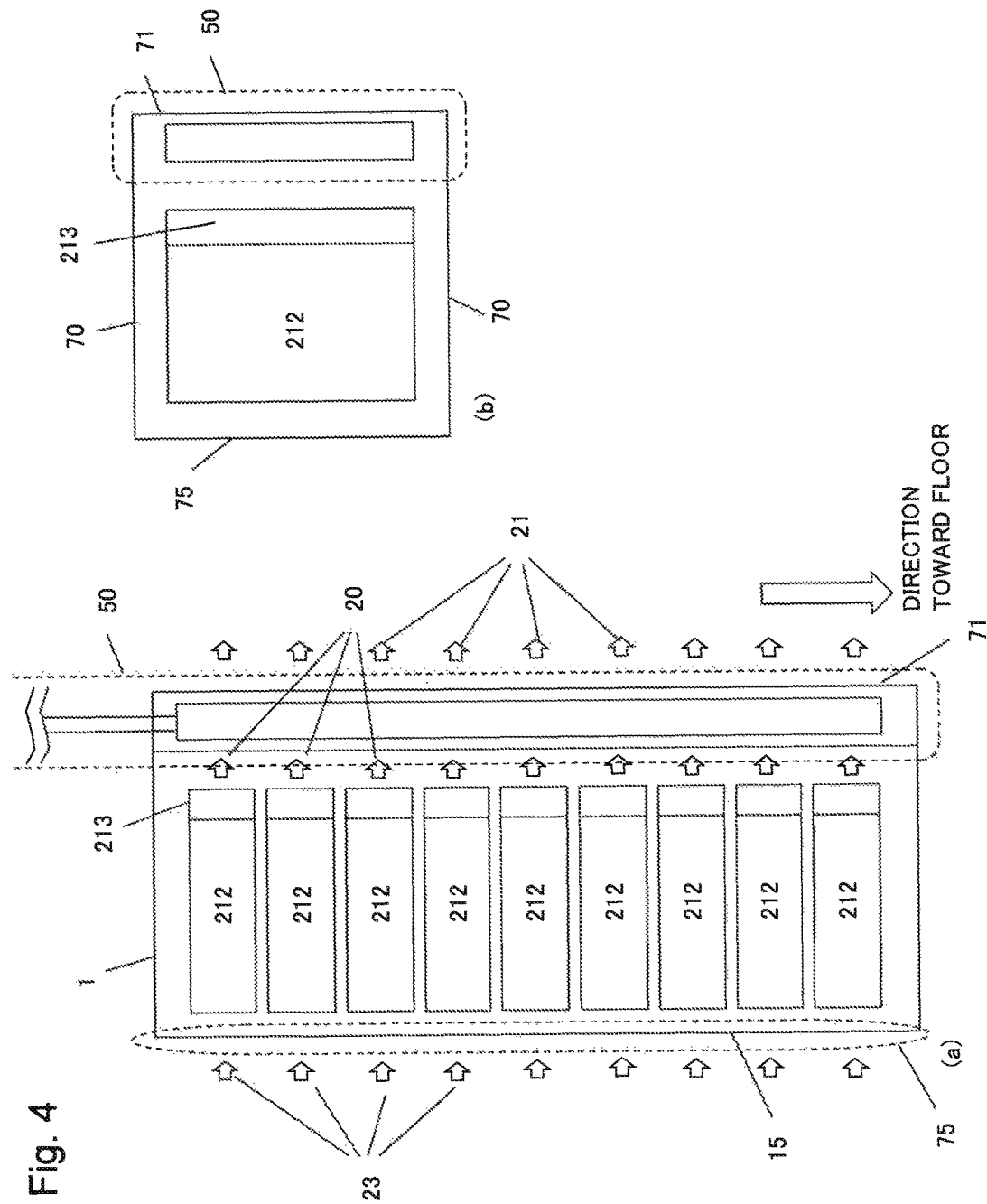
FIG. 4 shows conceptual views of a second electronic device according to the first example embodiment.

FIG. 4 shows a conceptual view of a second electronic device according to the first example embodiment. FIG. 4(*a*) is a side view and FIG. 4(*b*) is a top view. The second electronic device according to the first example embodiment includes a fan in the chassis. This is a difference between the second electronic device according to the first example embodiment and the first electronic device according to the first example embodiment.

The second electronic device according to the first example embodiment includes the chassis 1, nine electronic apparatuses 212, nine fans 213 corresponding to the electronic apparatuses 212, and the cooling system 50. In FIG. 4, nine electronic apparatuses 212 and nine fans 213 are shown. However the number of the electronic apparatuses 212 and the number of fans 213 can be arbitrarily determined. One electronic apparatus 212 and one fan 213 may be used. The number of the electronic apparatuses 212 may be different from the number of the fans 213.

The fan 213 sends air warmed by the electronic apparatus 212 to a part installed inside the chassis 1 of the cooling system 50. This air flow is the exhaust heat flow 20. The chassis front face 75 has a structure in which the through-hole is provided thereon or another thing is provided so that air can easily pass through the chassis front face 75. Therefore, when the fan 213 sends air around the electronic apparatus 212 in a chassis rear face 71 direction, air enters the chassis through the chassis front face 75. This generated air flow is called a suction flow 23. The exhaust heat flow 20 collides with a part disposed in the chassis 1 of the cooling system 50 and thereby is cooled. The cooled exhaust heat flow 20 is called the cooling flow 21. The cooling flow 21 is sent to the outside of the chassis 1 through the chassis rear face 71.

As the chassis 1, the electronic apparatus 212, and the cooling system 50 of the second electronic device according to the first example embodiment, typically, the same components as those of the first electronic device according to the first example embodiment can be used.

In the second electronic device according to the first example embodiment, the component that has to be installed in the chassis among the components of which the cooling system 50 is composed of can be mounted on the chassis door and a cooling system in which the component and the chassis door are integrated can be realized like the first electronic device according to the first example embodiment.

This second electronic device according to the first example embodiment includes the fan 213 in the chassis 1. Therefore, the exhaust heat flow 20 with a sufficient strength can be obtained. Accordingly, when the power consumption of the fan 213 and an amount of heat generated by the fan 213 can be reduced, the cooling efficiency can be more improved.

Thus, by using this first example embodiment, the electronic device in which heat generated in the electronic device can be more efficiently cooled can be realized.

Second Example Embodiment

A second example embodiment is an example embodiment of a cooling system of the present invention and typically, is an example embodiment of the cooling system included in the electronic device according to the first example embodiment.

Figure 5:
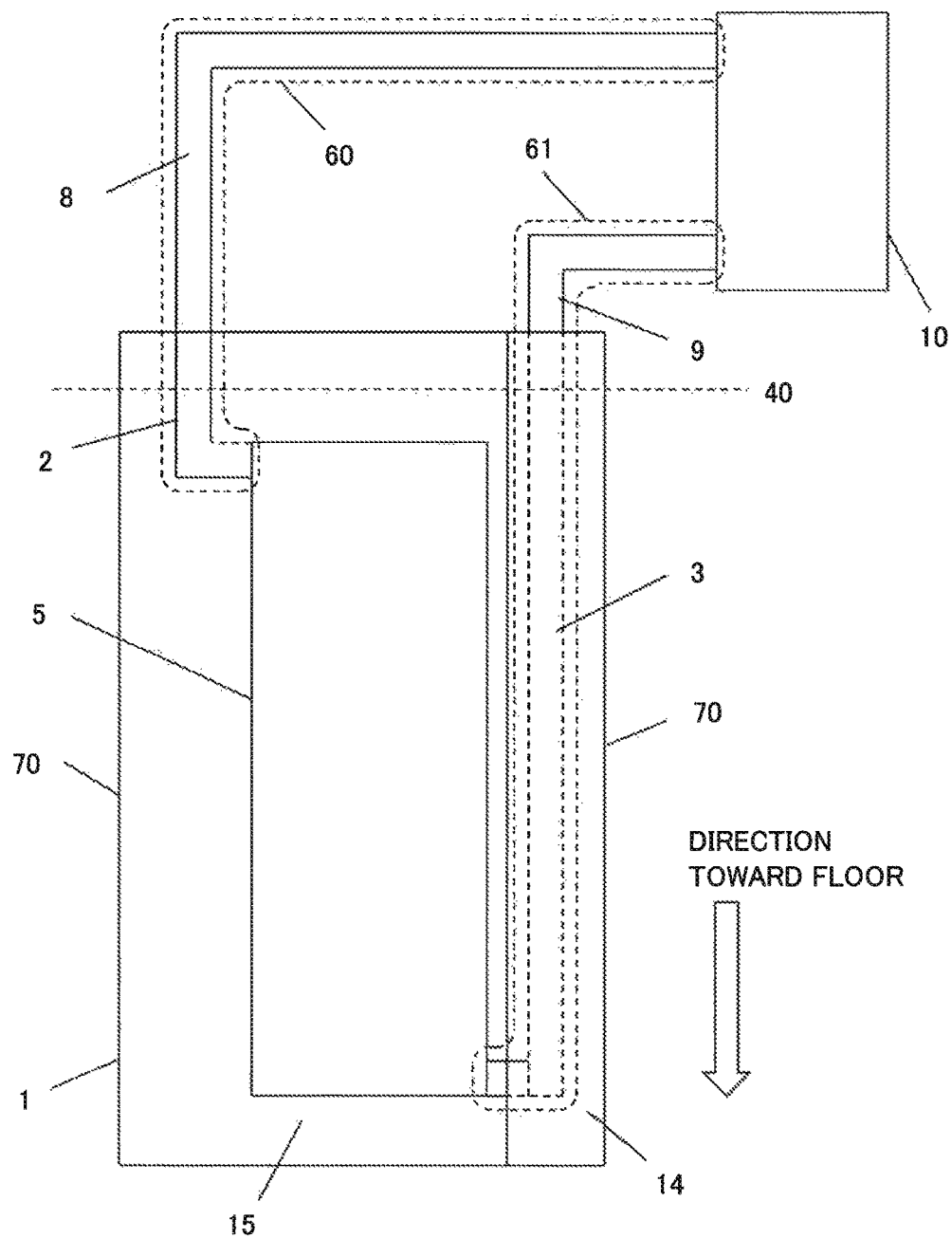
FIG. 5 shows a conceptual view of a first cooling system according to a second example embodiment.
Figure 6:
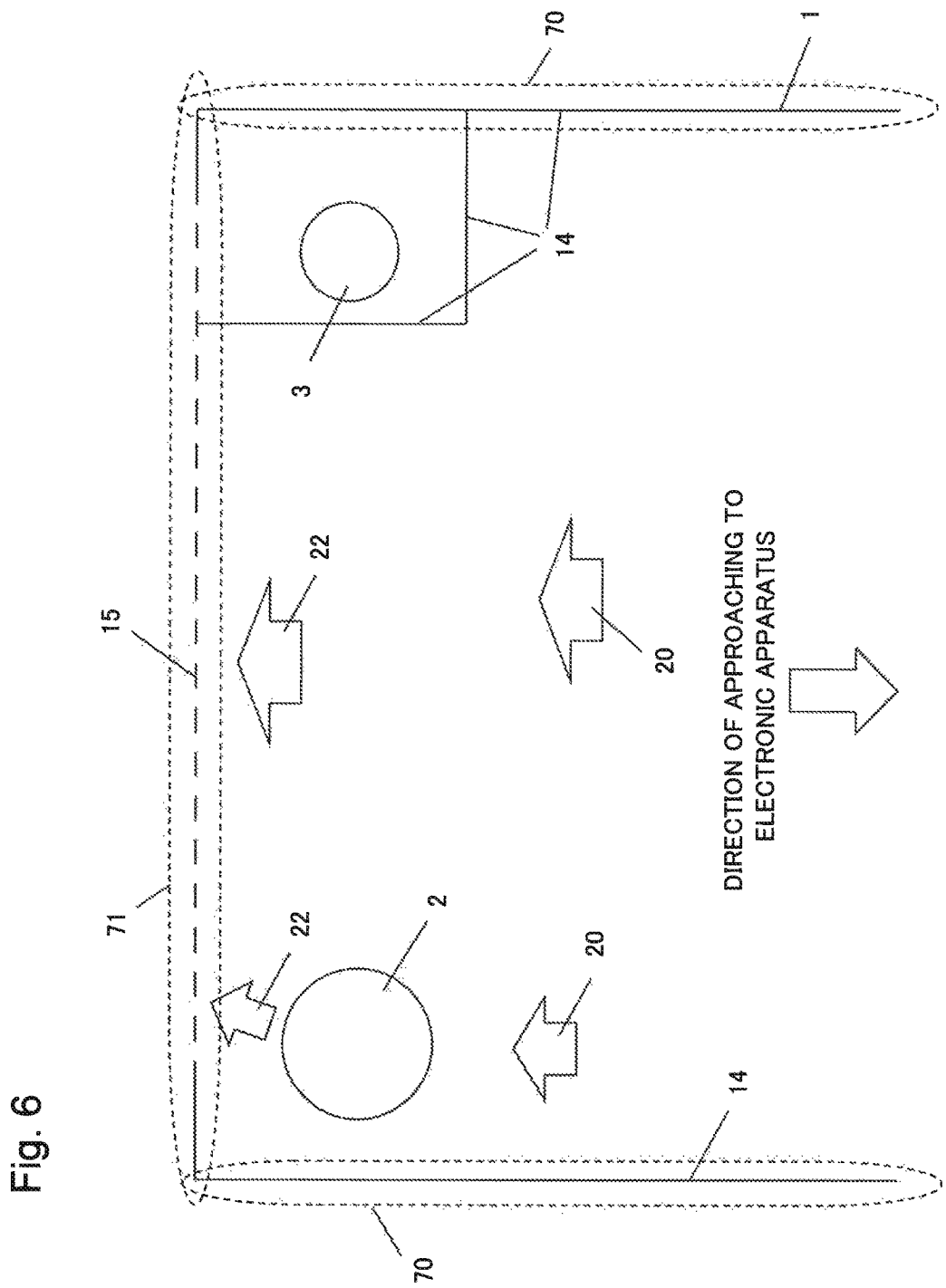
FIG. 6 shows a conceptual cross-sectional view of the first cooling system according to the second example embodiment.

FIG. 5 and FIG. 6 show a conceptual view of a first cooling system according to the second example embodiment. FIG. 6 shows a conceptual cross-sectional view of this cooling system along a dotted line indicating a second cutting position 40 in FIG. 5.

The first cooling system according to the second example embodiment includes the chassis 1, the heat receiving means 5, a gas phase pipe 2, a gas phase pipeline 8, the heat radiation means 10, a liquid phase pipeline 9, and a liquid phase pipe 3. The heat receiving means 5, the gas phase pipe 2, and the liquid phase pipe 3 are installed in the chassis 1. The heat receiving means 5 receives the exhaust heat flow 20 and change the liquid phase medium into the gas phase medium. At this time, heat is stored in the gas phase medium. The gas phase pipe 2 is installed in the chassis 1 and transfers the gas phase medium to the gas phase pipeline 8 disposed outside the chassis 1. The gas phase pipeline 8 transfers the gas phase medium transferred from the gas phase pipe 2 to the heat radiation means 10. The first transfer means 60 are composed of the gas phase pipe 2 and the gas phase pipeline 8. The heat radiation means 10 change the gas phase medium transferred through the gas phase pipeline 8 into the liquid phase medium and radiate the heat stored in the gas phase medium. The liquid phase pipeline 9 transfers the liquid phase medium from the heat radiation means 10 to the liquid phase pipe 3 installed in the chassis 1. The liquid phase pipe 3 transfers the liquid phase medium to the heat receiving means 5. The second transfer means 61 is composed of the liquid phase pipeline 9 and the liquid phase pipe 3.

Figure 7:
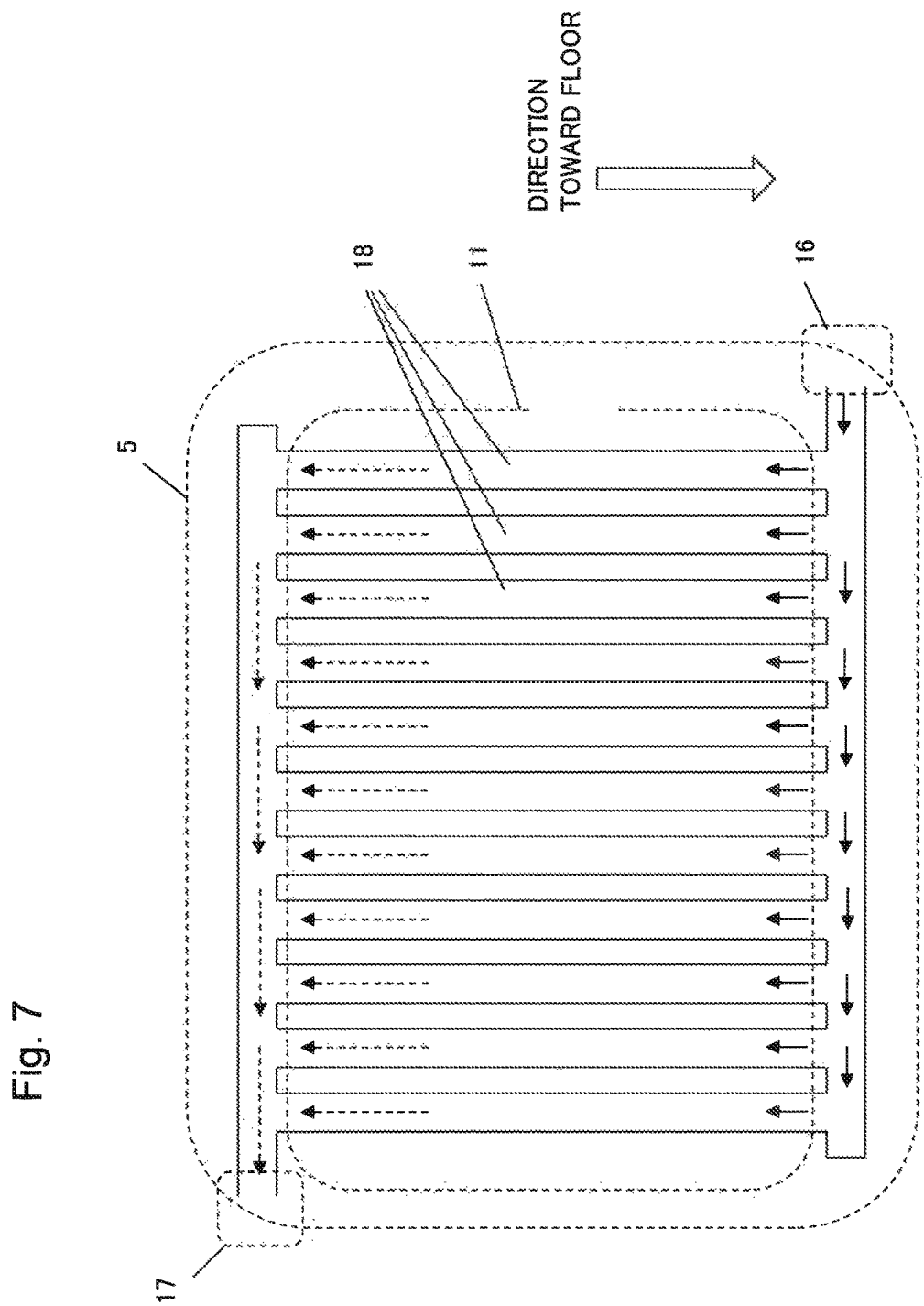
FIG. 7 shows an example of heat receiving means which can be applied to the present invention.

FIG. 7 shows an example of heat receiving means and this type of heat receiving means can be used as the heat receiving means 5. As shown in FIG. 7, the liquid phase medium which flows into the heat receiving means 5 through an inlet 16 flows in the direction of a solid arrow and flows into each gasification unit branch 18 of a gasification unit 11. The liquid phase medium receives heat in the gasification unit branch 18 and changes into the gas phase medium. The gas phase medium flows upward. Because the liquid phase medium exists in the gasification unit branch 18 located at a position lower than the position at which the gas phase medium exists, the gas phase medium cannot flow downward and flows upward. In this cooling system, a force generated when the gas phase medium flows upward is at least a part of a driving force for circulating the heat medium in this cooling system. The gas phase medium flows in the direction of a dotted line arrow in FIG. 7 and flows out to the outside of the heat receiving means 5 through an outlet 17 of the heat receiving means 5. This gas phase medium has heat.

The heat radiation means 10 may exchange heat between the gas phase medium and water and radiate heat or exchange heat between air and the gas phase medium and radiate heat. When heat is exchanged between the gas phase medium and water, the warmed water is cooled by a chiller or a cooling tower and circulated by a pump or the like. When heat is exchanged between air and the gas phase medium, the gas phase medium is sent to the heat radiation means 10 by a fan or the like, the air obtained by exchanging heat between air and the gas phase medium is discharged in a space separated from a space in which the rack is disposed.

A pump or the like may be disposed in the heat radiation means 10 or the second transfer means 61 (the liquid phase pipeline 9 or the liquid phase pipe 3) and by operating the pump or the like, the operation to transfer the liquid phase medium from the second transfer means 61 to the heat receiving means 5 may be assisted.

Figure 9:
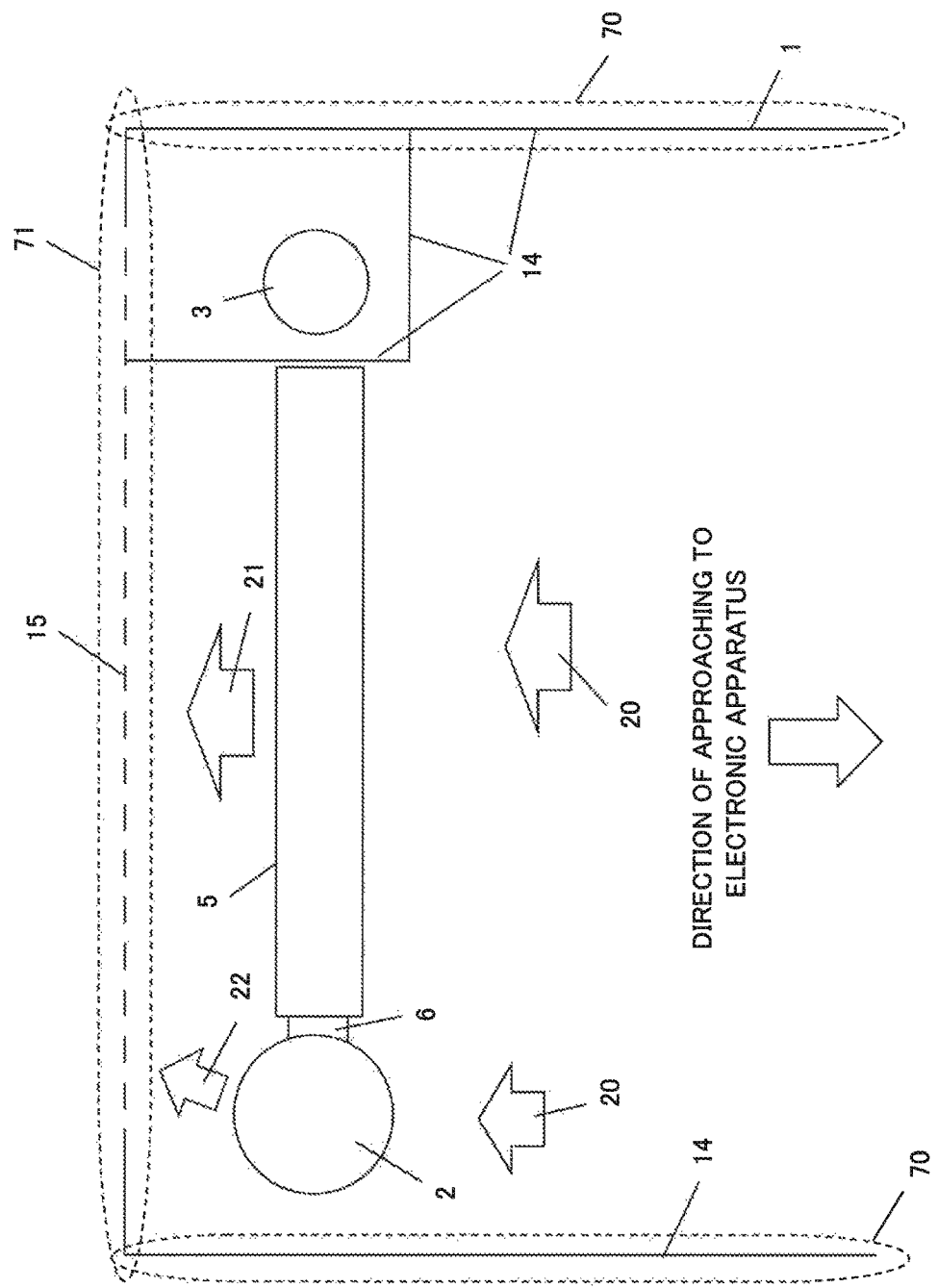
FIG. 9 shows a conceptual cross-sectional view of the second cooling system according to a second example embodiment.

In FIG. 9, the cross-sectional shape of the gas phase pipe 2 and the liquid phase pipe 3 is circular. However, it can be arbitrarily determined. Further, the cross-sectional shape of the gas phase pipeline 8 and the liquid phase pipeline 9 can be also arbitrarily determined.

In order to prevent the gas phase medium in the gas phase pipeline 8 from being cooled and liquefied, the gas phase pipeline 8 may be covered by a heat insulation material or heated by a heater. When the gas phase pipeline 8 is heated by the heater, exhaust heat of the electronic apparatus can be used as a heat source.

The heat medium having electrical insulation properties is used because it is used in the electronic apparatuses. Specifically, HFC (hydro fluorocarbon) or HFE (hydro fluoro ether) can be used. However, it is not limited to these materials.

A chassis side face 70 is composed of a non-ventilation wall 14 (a through-hole is not provided thereon or a small number of through-holes is provided thereon and whereby, air hardly passes through the wall in comparison with the ventilation wall 15. Hereinafter the same will apply) and whereby, air hardly passes through the chassis side face 70. Therefore, when the exhaust heat flow 20 collides with the chassis side face 70, it flows toward the chassis rear face 71 while bouncing. The chassis rear face 71 is composed of the ventilation wall 15.

The exhaust heat flow 20 collides with the heat receiving means 5 and the gas phase pipe 2. The exhaust heat flow 20 which collides with the heat receiving means 5 is cooled when the liquid phase medium is changed into the gas phase medium in the heat receiving means 5, the gas phase medium flows toward the chassis rear face 71 as the cooling flow 21 (not shown in FIG. 6), and the cooling flow 21 is sent to the outside the chassis 1.

On the other hand, the exhaust heat flow 20 which collides with the gas phase pipe 2 or the exhaust heat flow 20 which passes through a place at which the gas phase pipe 2 or the heat receiving means 5 does not exist flows toward the chassis rear face 71 as a non-cooling flow 22 almost without being cooled and is sent to the outside the chassis 1. The exhaust heat flow 20 collides with at least a part of the gas phase pipe 2 and whereby, a part of the gas phase pipe 2 with which the exhaust heat flow 20 collides is warmed. The occurrence probability of a case in which the inside of the first transfer means 60 is warmed, the gas phase medium is changed into the liquid phase medium by the cooling, and whereby, the flow of the gas phase medium in the first transfer means 60 is blocked decreases. This is because, for example, when the gas phase medium with sufficiently high temperature can be secured at the outlet of the gas phase pipe 2, even if the gas phase medium is cooled a little in the gas phase pipeline 8 disposed outside the chassis 1, the probability that the gas phase medium can be maintained without being changed into the liquid phase medium until the gas phase medium reaches the heat radiation means 10 increases. Accordingly, the gas phase medium smoothly flows in the first transfer means 60. Therefore, an amount of the liquid phase medium which is changed into the gas phase medium per unit time in the heat receiving means 5 increases and the cooling can be more efficiently performed in comparison with a case in which the exhaust heat flow 20 does not collide with the first transfer means.

Further, in order to enclose the liquid phase pipe 3 with the walls, the non-ventilation wall 14 is disposed at a place at which the chassis side face 70 and the chassis rear face 71 do not exist. This is because a problem in which the exhaust heat flow 20 collides with the liquid phase pipe 3, the liquid phase medium changes into the gas phase medium in the liquid phase pipe 3, and whereby, the flow of the liquid phase medium that flows in the heat receiving means 5 direction is blocked can be prevented. In FIG. 5, the liquid phase pipe 3 is indicated by a dotted line. This is because the non-ventilation wall 14 is disposed on the near side of FIG. 5. Namely, the non-ventilation wall 14 is disposed so that the non-ventilation wall 14 faces the chassis rear face 71 of the liquid phase pipe 3. Therefore, in FIG. 5, the liquid phase pipe 3 is viewed through the non-ventilation wall 14. The structure is shown in the same manner in the following drawings.

In FIG. 6, the exhaust heat flow 20 collides with the first transfer means 60 at approximately right angle. However, the angle can be arbitrarily determined.

Figure 8:
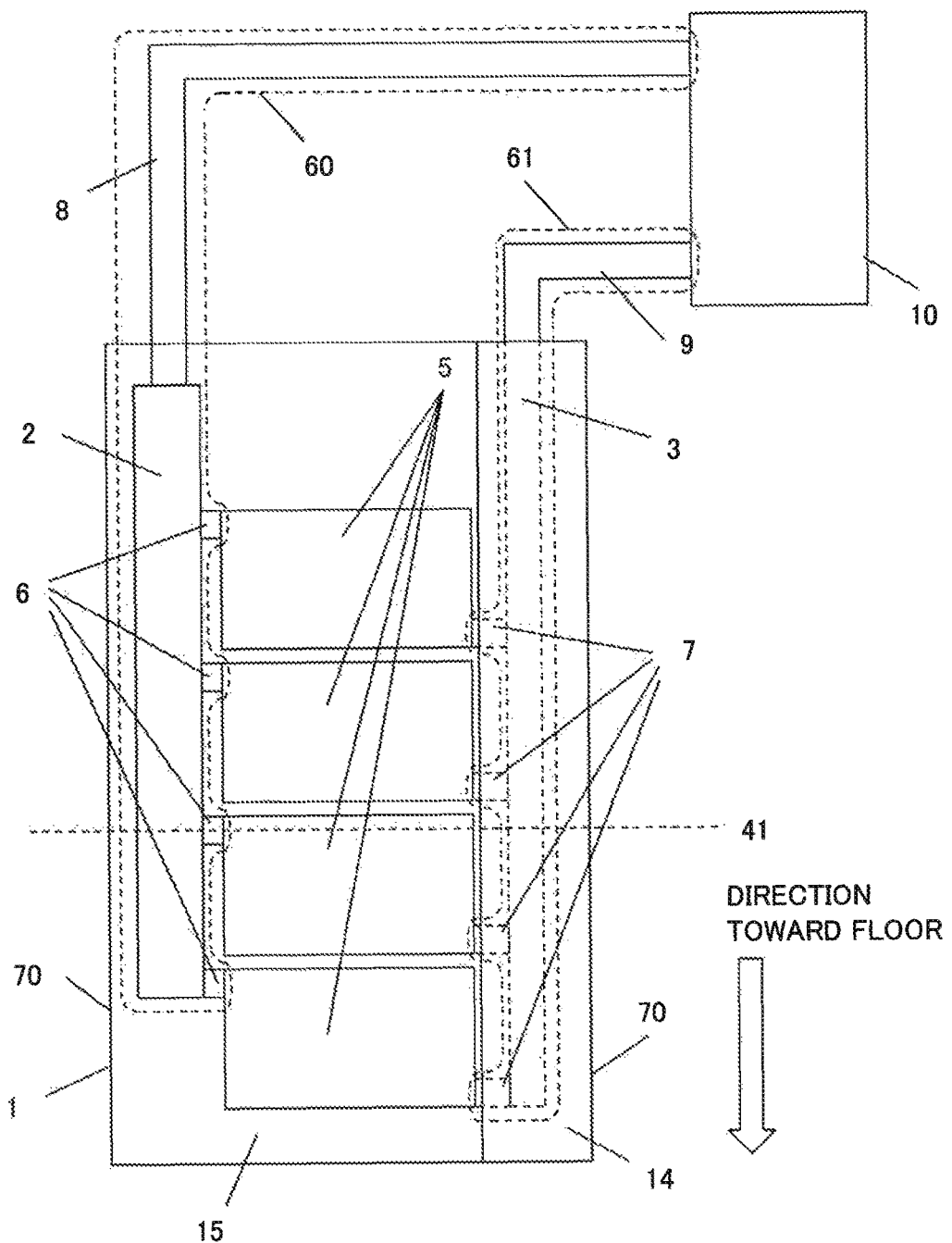
FIG. 8 shows a conceptual view of a second cooling system according to the second example embodiment.

FIG. 8 and FIG. 9 show a conceptual view of a second cooling system according to the second example embodiment. The second cooling system includes a plurality of heat receiving means 5. The number of the heat receiving means 5 can be arbitrarily determined. A case in which the number of the heat receiving means 5 is four will be described here. FIG. 9 shows a conceptual cross-sectional view of the second cooling system according to the second example embodiment along a dotted line indicating a third cutting position 41 in FIG. 8.

The second cooling system according to the second example embodiment includes the chassis 1, four heat receiving means 5, four gas phase pipe branches 6, the gas phase pipe 2, the gas phase pipeline 8, the heat radiation means 10, the liquid phase pipeline 9, the liquid phase pipe 3, and four liquid phase pipe branches 7.

Four heat receiving means 5, four gas phase pipe branches 6, the gas phase pipe 2, the liquid phase pipe 3, and four liquid phase pipe branches 7 are installed in the chassis 1. Each of four heat receiving means 5 receives heat generated by the electronic apparatus (not shown here) and changes the liquid phase medium into the gas phase medium. At this time, heat is stored in the gas phase medium. The gas phase pipe branch 6 transfers the gas phase medium to the gas phase pipe 2. The gas phase pipe 2 is installed in the chassis 1 and transfers the gas phase medium to the gas phase pipeline 8 disposed outside the chassis 1. The gas phase pipeline 8 transfers the gas phase medium transferred from the gas phase pipe 2 to the heat radiation means 10. The first transfer means 60 is composed of the gas phase pipe branch 6, the gas phase pipe 2, and the gas phase pipeline 8. The heat radiation means 10 changes the gas phase medium transferred through the gas phase pipeline 8 into the liquid phase medium by the cooling and thereby, radiate heat stored in the gas phase medium. The liquid phase pipeline 9 transfers the liquid phase medium from the heat radiation means 10 to the liquid phase pipe 3 installed in the chassis 1. The liquid phase medium flowing in the liquid phase pipe 3 is distributed to four liquid phase pipe branches 7. Each of the liquid phase pipe branches 7 transfers the distributed liquid phase medium to the corresponding heat receiving means 5. The second transfer means 61 is composed of the liquid phase pipeline 9, the liquid phase pipe 3, and the liquid phase pipe branch 7.

The heat receiving means 5, the heat radiation means 10, the gas phase pipe 2, the liquid phase pipe 3, the gas phase pipeline 8, the liquid phase pipeline 9, and the heat medium used in the first cooling system according to the second example embodiment can be used for the second cooling system according to the second example embodiment.

A pump or the like may be disposed in the heat radiation means 10 or the second transfer means 61 (the liquid phase pipeline 9 or the liquid phase pipe 3) and by operating the pump or the like, the operation to transfer the liquid phase medium from the second transfer means 61 to the heat receiving means 5 can be assisted.

The chassis side face 70 includes the non-ventilation wall 14. Therefore, the exhaust heat flow 20 that collides with the chassis side face 70 flows in the chassis rear face 71 direction while bouncing. The chassis rear face 71 includes the ventilation wall 15.

The exhaust heat flow 20 collides with the heat receiving means 5 and the gas phase pipe 2. The exhaust heat flow 20 which collides with the heat receiving means 5 is cooled when the liquid phase medium is changed into the gas phase medium in the heat receiving means 5, the gas phase medium flows toward the chassis rear face 71 as the cooling flow 21, and the cooling flow 21 is sent to the outside of the chassis 1 through the chassis rear face 71.

On the other hand, the exhaust heat flow 20 which collides with the gas phase pipe 2 and the exhaust heat flow 20 (not shown here) which passes through a place at which the gas phase pipe 2 or the heat receiving means 5 does not exist flow toward the chassis rear face 71 as the non-cooling flow 22 almost without being cooled and is sent to the outside the chassis 1.

The exhaust heat flow 20 collides with at least a part of the gas phase pipe 2. Accordingly, a part of the gas phase pipe 2 with which the exhaust heat flow 20 collides is warmed.

As a result, the occurrence probability of a case in which the inside of the first transfer means 60 is warmed, the gas phase medium is changed into the liquid phase medium by the cooling, and whereby, the flow of the gas phase medium in the first transfer means 60 is blocked decreases. This is because, for example, when the gas phase medium with sufficiently high temperature can be secured at the outlet of the gas phase pipe 2, even if the gas phase medium is cooled a little in the gas phase pipeline 8 disposed outside the chassis 1, the probability that the gas phase medium can be maintained without being changed into the liquid phase medium until the gas phase medium reaches the heat radiation means 10 increases. Accordingly, the gas phase medium more smoothly flows in the first transfer means 60. Therefore, an amount of the liquid phase medium which is changed into the gas phase medium per unit time in the heat receiving means 5 increases and the cooling can be more efficiently performed in comparison with a case in which the exhaust heat flow 20 does not collide with the first transfer means 60.

In FIG. 9, the exhaust heat flow 20 collides with the first transfer means 60 at approximately right angle. However, the angle can be arbitrarily determined.

Figure 10:
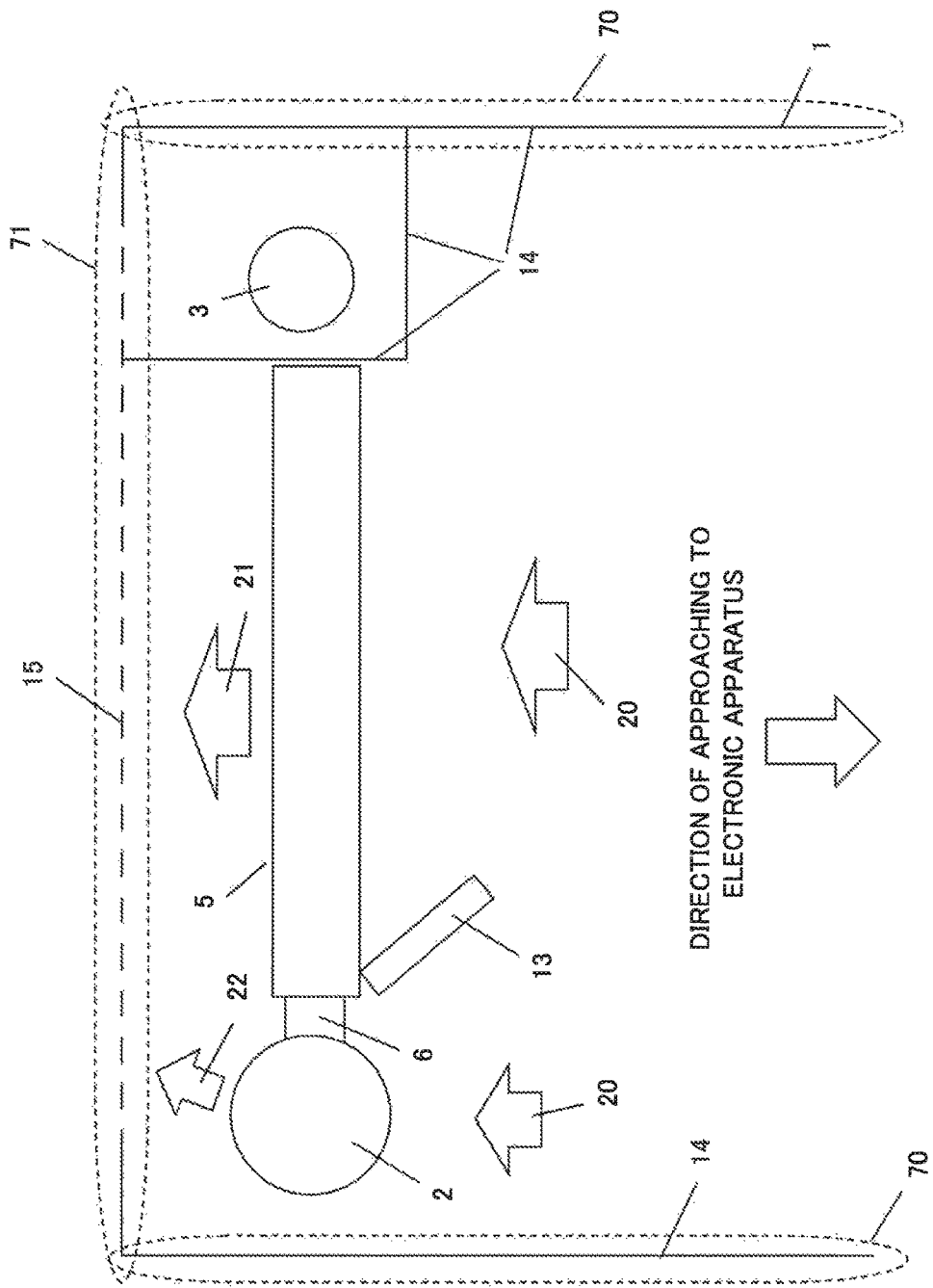
FIG. 10 shows a conceptual cross-sectional view showing a third cooling system according to the second example embodiment.

FIG. 10 shows a conceptual cross-sectional view showing a third cooling system according to the second example embodiment. In the third cooling system according to the second example embodiment, the exhaust heat flow 20 is flown into the gas phase pipe 2 or an air guide member 13 by which the exhaust heat flow 20 is prevented from being excessively flown into the gas phase pipe 2 is disposed. This is a difference between the second cooling system according to the second example embodiment and the third cooling system according to the second example embodiment. This air guide member 13 is heat adjustment means for adjusting an amount of the exhaust heat flow that collides with at least a part of the first transfer means. A case in which a cross-sectional shape of the air guide member is rectangular is shown here. However, it can be arbitrarily determined. Further, a setting angle and a setting position are matters of design. Namely, by changing the size, the shape, or the setting position of the air guide member 13, the amount of the exhaust heat flow 20 that flows into the gas phase pipe 2 can be adjusted.

Thus, the cooling device according to the second example embodiment can more efficiently perform the cooling in comparison with a case in which the exhaust heat flow does not collide with the first transfer means.

Third Example Embodiment

A third example embodiment is an example embodiment of a cooling system in which with respect to a flow of air, as heat adjustment means for adjusting an amount of the exhaust heat flow that collides with at least a part of the first transfer means, a wall through which air hardly passes is disposed at the downstream side of the first transfer means.

Figure 11:
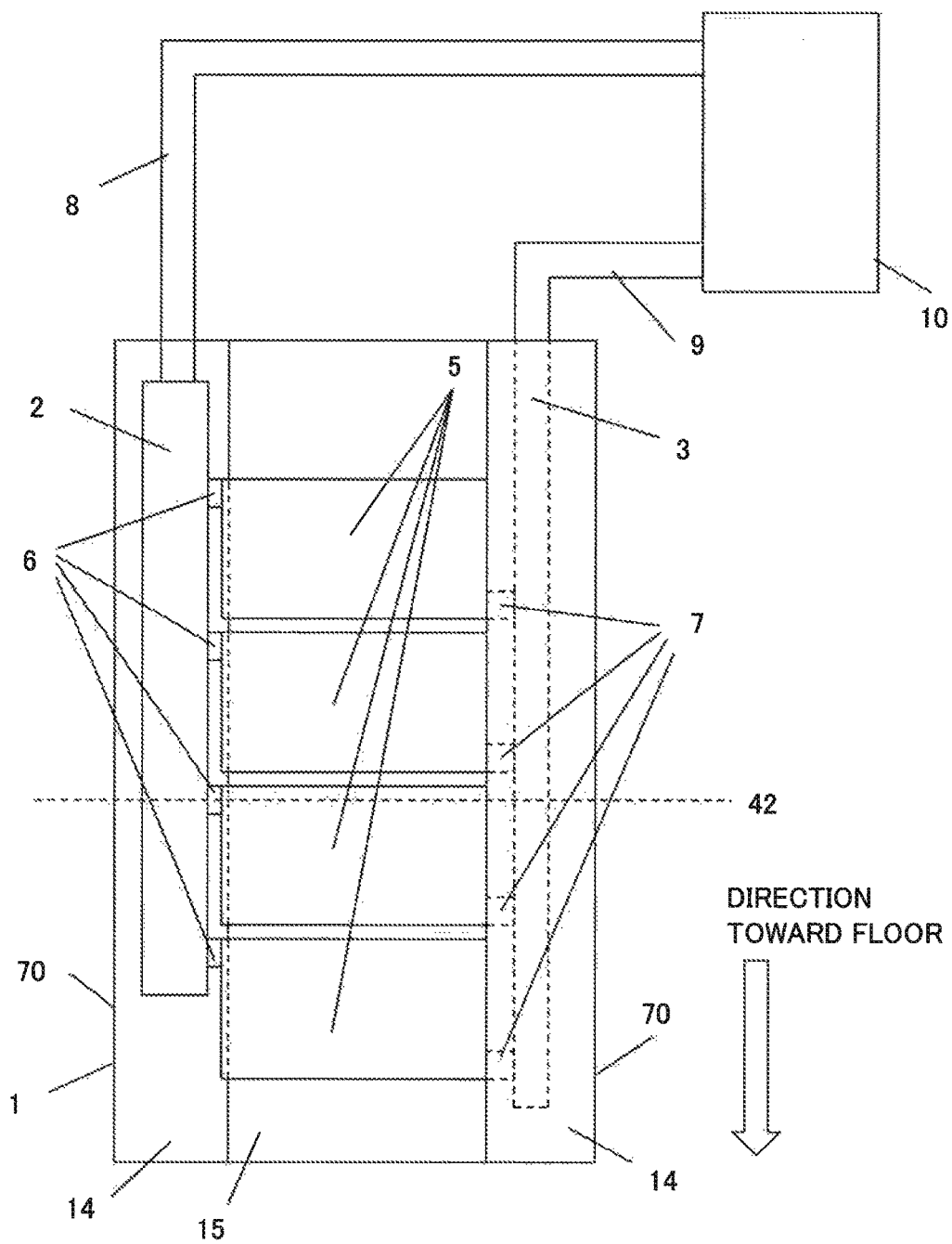
FIG. 11 shows a conceptual view of a cooling system according to a third example embodiment.
Figure 12:
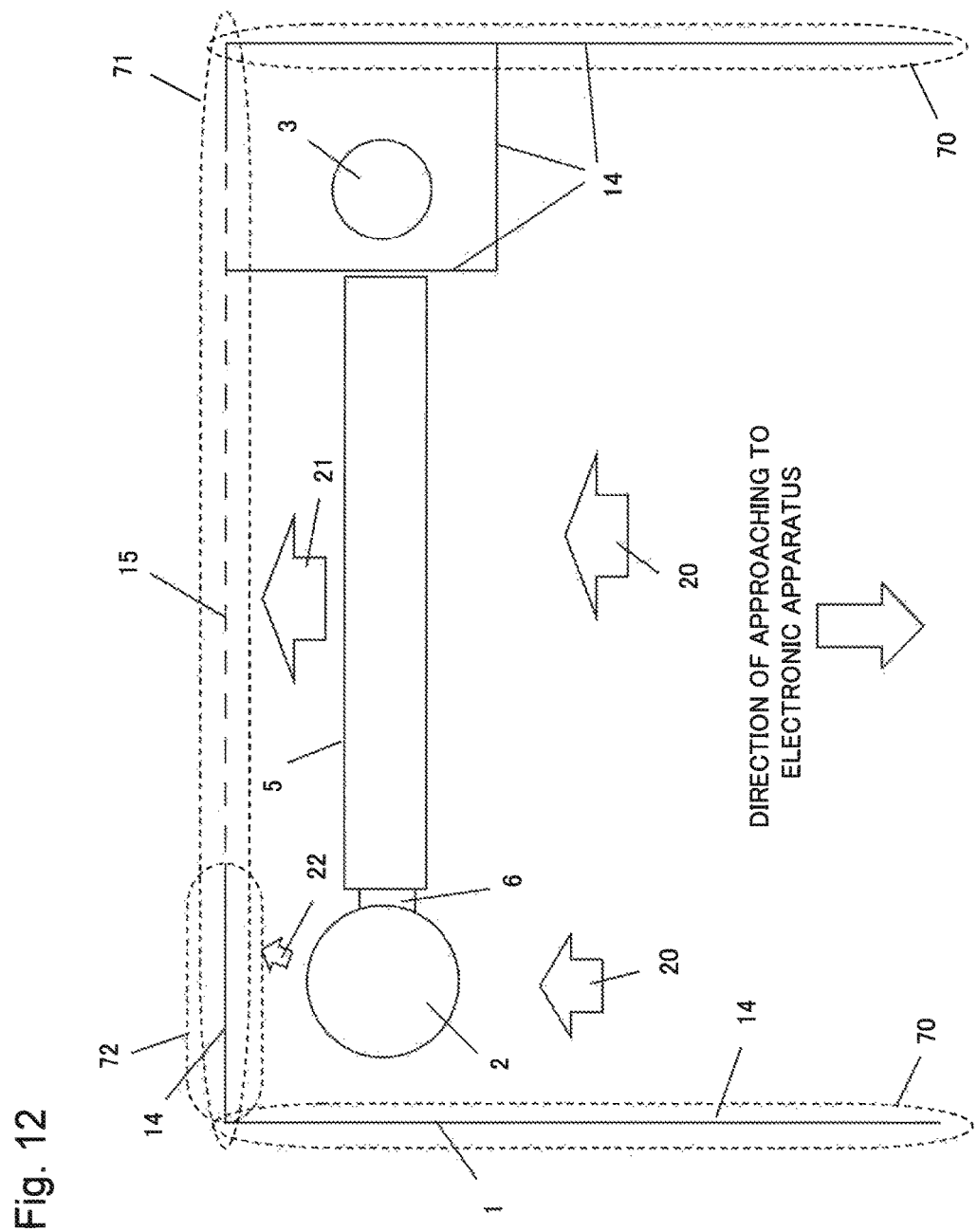
FIG. 12 shows a conceptual cross-sectional view of the cooling system according to the third example embodiment.

FIG. 11 and FIG. 12 show a conceptual view of a cooling system according to the third example embodiment. The number of the heat receiving means 5 can be arbitrarily determined. A case in which the number of the heat receiving means 5 is four will be described here. FIG. 12 shows a conceptual cross-sectional view of the cooling system according to the third example embodiment along a dotted line indicating a fourth cutting position 42 in FIG. 11.

A cooling system according to the third example embodiment includes the chassis 1, four heat receiving means 5, four gas phase pipe branches 6, the gas phase pipe 2, the gas phase pipeline 8, the heat radiation means 10, the liquid phase pipeline 9, the liquid phase pipe 3, and four liquid phase pipe branches 7. This structure is the same as that of the second cooling system according to the second example embodiment. Further, the function of each component of this cooling system is almost the same as that of the second cooling system according to the second example embodiment. Therefore, explanation of the same component is omitted and only different point will be described.

A first cooling system according to the third example embodiment is characterized in that as shown in FIG. 12, with respect to the flow of the exhaust heat flow 20, a non-ventilation rear face 72 (it is the chassis rear face 71 composed of the non-ventilation wall 14 and hereinafter the same will apply) is disposed in the chassis rear face 71 located at the downstream side of the gas phase pipe 2. The non-ventilation rear face 72 is disposed at the downstream side of the gas phase pipe 2. Accordingly, a flow resistance of the exhaust heat flow 20 increases at the position of the gas phase pipe 2. Therefore, although the exhaust heat flow 20 collides with the gas phase pipe 2, the non-cooling flow 22 passing through a position of the gas phase pipe 2 decreases in comparison with a case in which the non-ventilation rear face 72 is not disposed. Therefore, the exhaust heat flow 20 can be more efficiently cooled in comparison with a case in which the non-ventilation rear face 72 is not disposed.

Fourth Example Embodiment

A fourth example embodiment is an example embodiment in which with respect to the flow of air, the non-ventilation wall is further disposed around the first transfer means. In this case, the non-ventilation wall disposed around the first transfer means is the heat adjustment means for adjusting the amount of the exhaust heat flow that collides with at least a part of the first transfer means.

Figure 13:
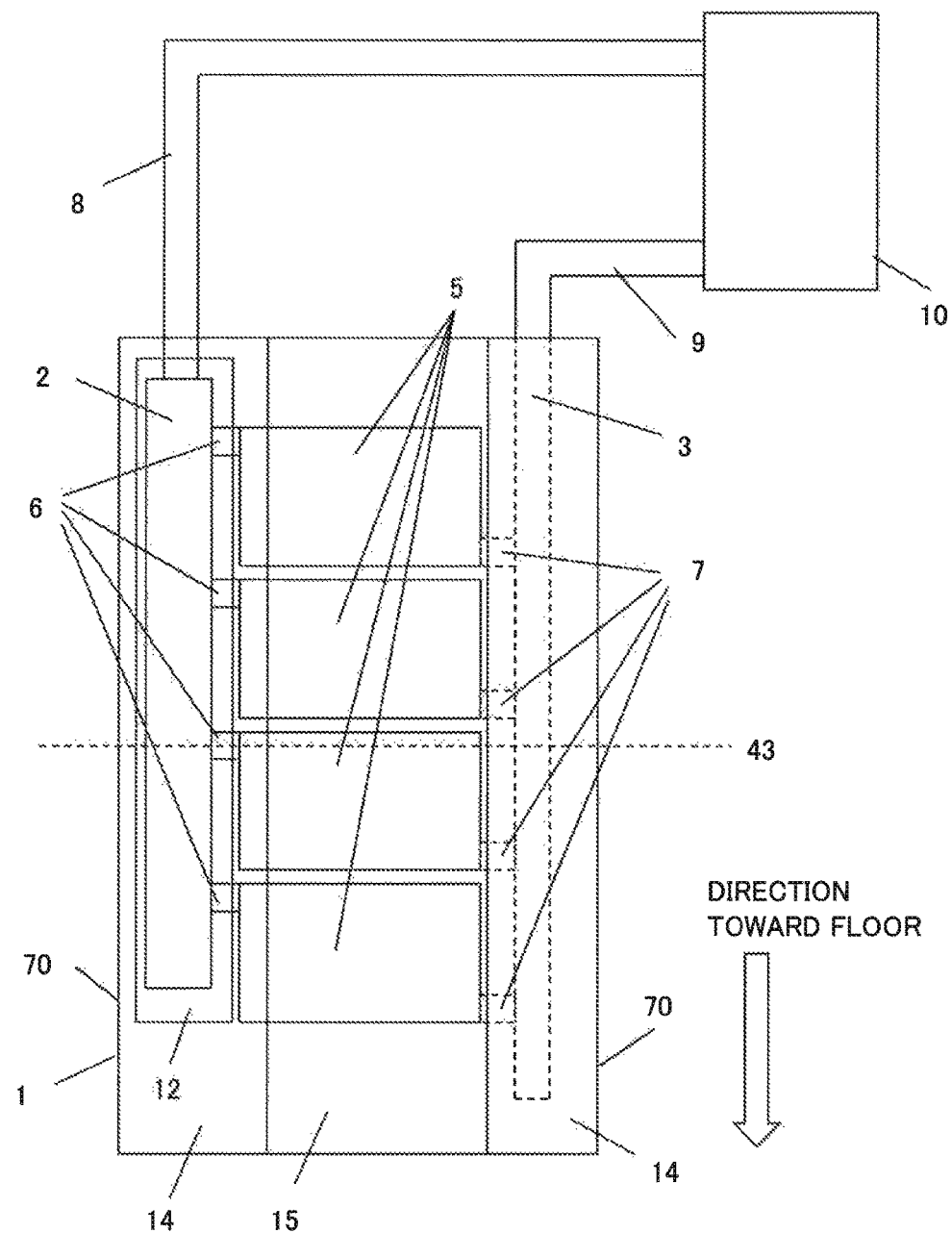
FIG. 13 shows a conceptual view of a cooling system according to a fourth example embodiment.
Figure 14:
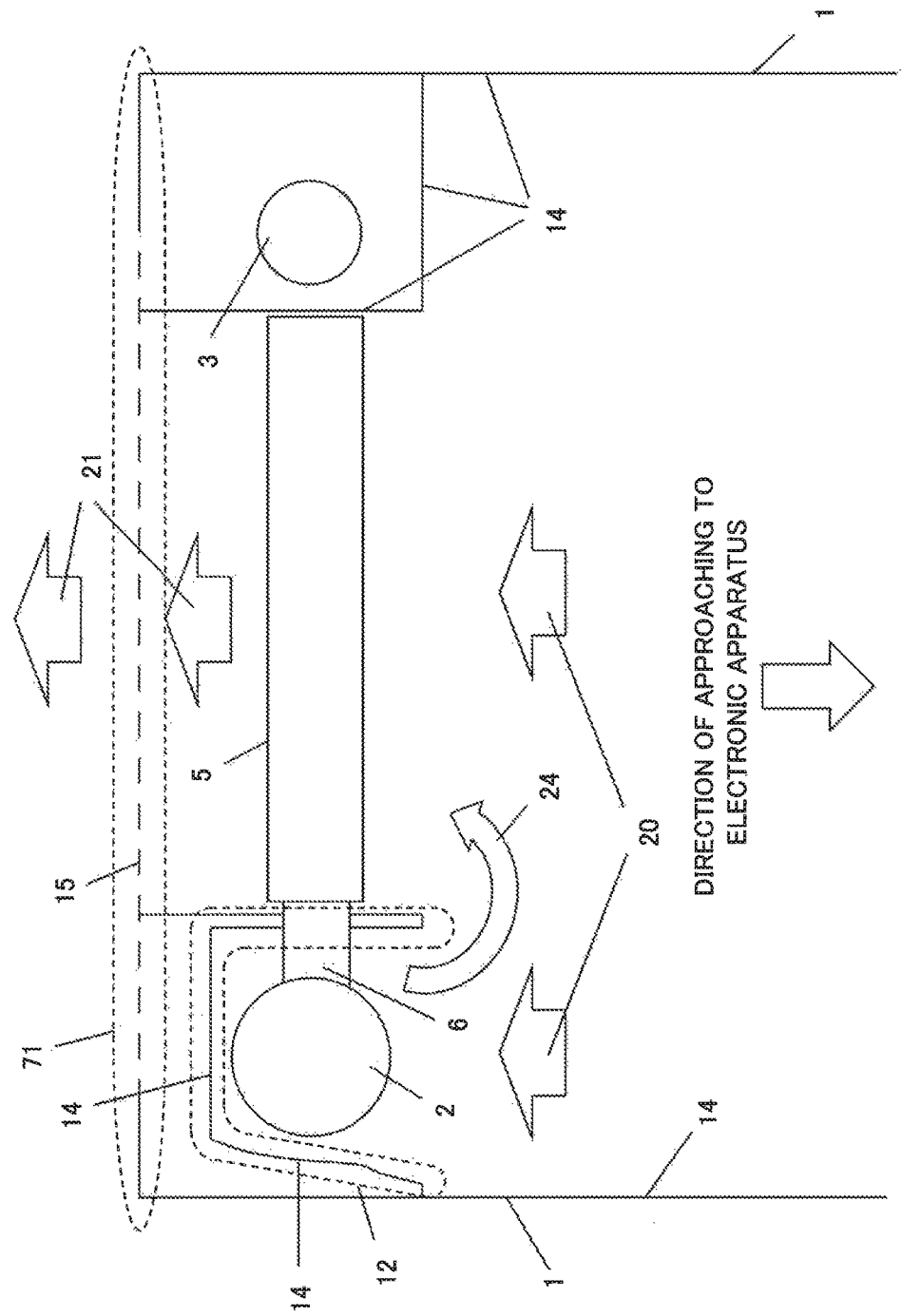
FIG. 14 shows a conceptual cross-sectional view of the cooling system according to the fourth example embodiment.

FIG. 13 and FIG. 14 show a conceptual view of a cooling system according to the fourth example embodiment. The number of the heat receiving means 5 can be arbitrarily determined. A case in which the number of the heat receiving means 5 is four will be described here. FIG. 14 shows a conceptual cross-sectional view of the cooling system according to the fourth example embodiment along a dotted line indicating a fifth cutting position 43 in FIG. 13.

The cooling system according to the fourth example embodiment includes the chassis 1, four heat receiving means 5, four gas phase pipe branches 6, the gas phase pipe 2, the gas phase pipeline 8, the heat radiation means 10, the liquid phase pipeline 9, the liquid phase pipe 3, and four liquid phase pipe branches 7. The function of each component of this cooling system is almost the same as that of the second cooling system according to the second example embodiment. Therefore, explanation of the same component is omitted and only different point will be described.

A cooling system according to the fourth example embodiment is characterized in that as shown in FIG. 14, the end of the gas phase pipe 2 is opened at the upstream of the exhaust heat flow 20 and the non-ventilation wall 14 is disposed around the gas phase pipe 2 except for the opening. Hereinafter, the non-ventilation wall 14 disposed around this gas phase pipe 2 is referred to as a duct 12. Here, the entire gas phase pipe 2 except for the opening is not necessarily covered by the non-ventilation wall 14 and it is necessary to cover almost the entire gas phase pipe 2. When this duct 12 is disposed, an exhaust heat flow 24 which collides with the gas phase pipe 2 passes through the heat receiving means 5 at a high probability without flowing toward the chassis rear face 71. This means that with respect to the flow of the exhaust heat flow 20, the gas phase pipe 2 is located at the upstream side of the heat receiving means 5. Therefore, the exhaust heat flow 20 can be more efficiently cooled in comparison with a case in which the duct 12 is not disposed or the structure described in the third example embodiment is used.

By disposing the duct 12, the exhaust heat flow 20 can collide with a surrounding part of the gas phase pipe 2 relatively uniformly and whereby, the gas phase pipe can be more effectively warmed by the exhaust heat flow 20.

Fifth Example Embodiment

A fifth example embodiment is an example embodiment in which the first transfer means 60 installed in the chassis 1 is disposed so that the center of the first transfer means 60 is between the center of the heat receiving means 5 and the position at which the electronic apparatus is located.

Figure 15:
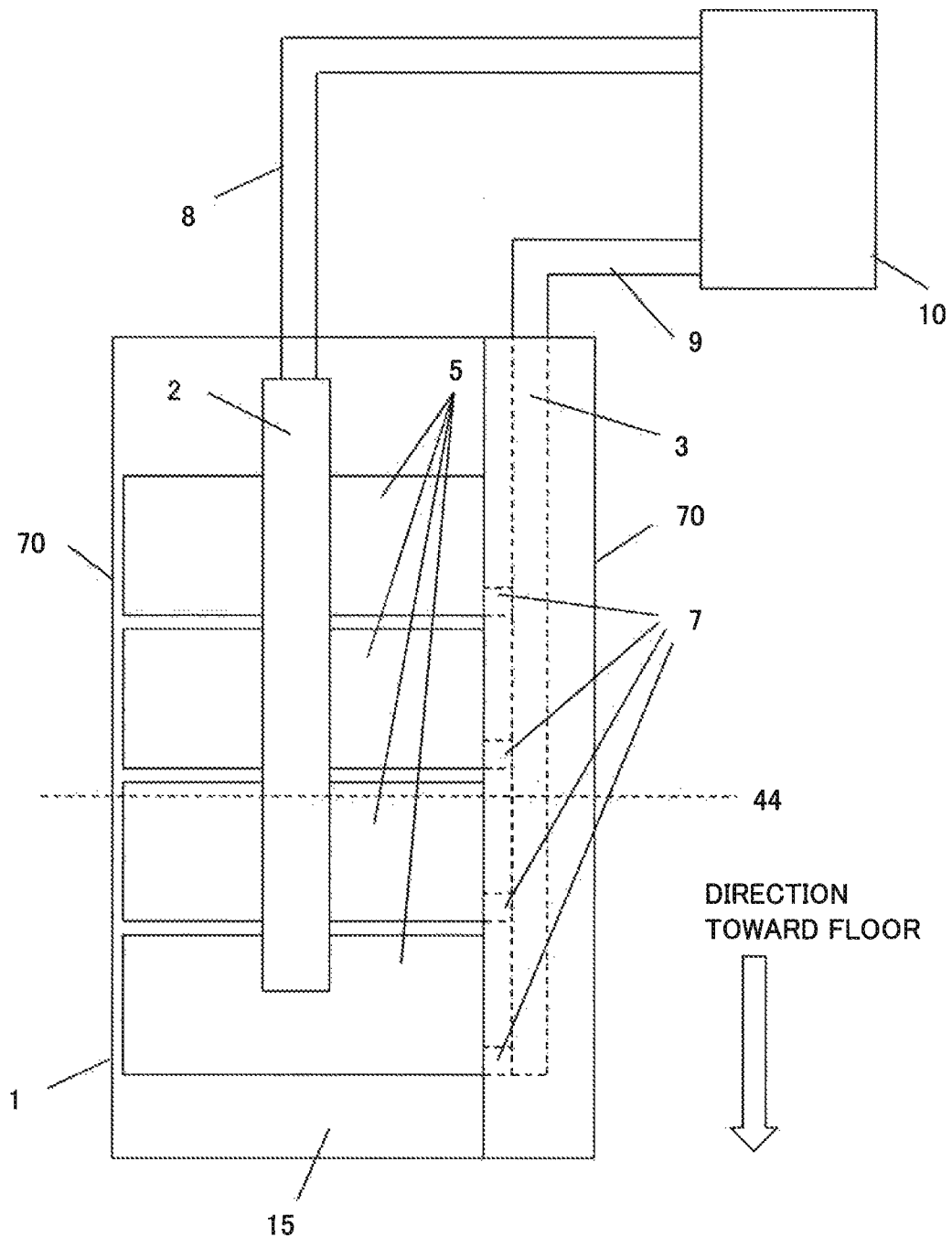
FIG. 15 shows a conceptual view of a first cooling system according to a fifth example embodiment.
Figure 16:
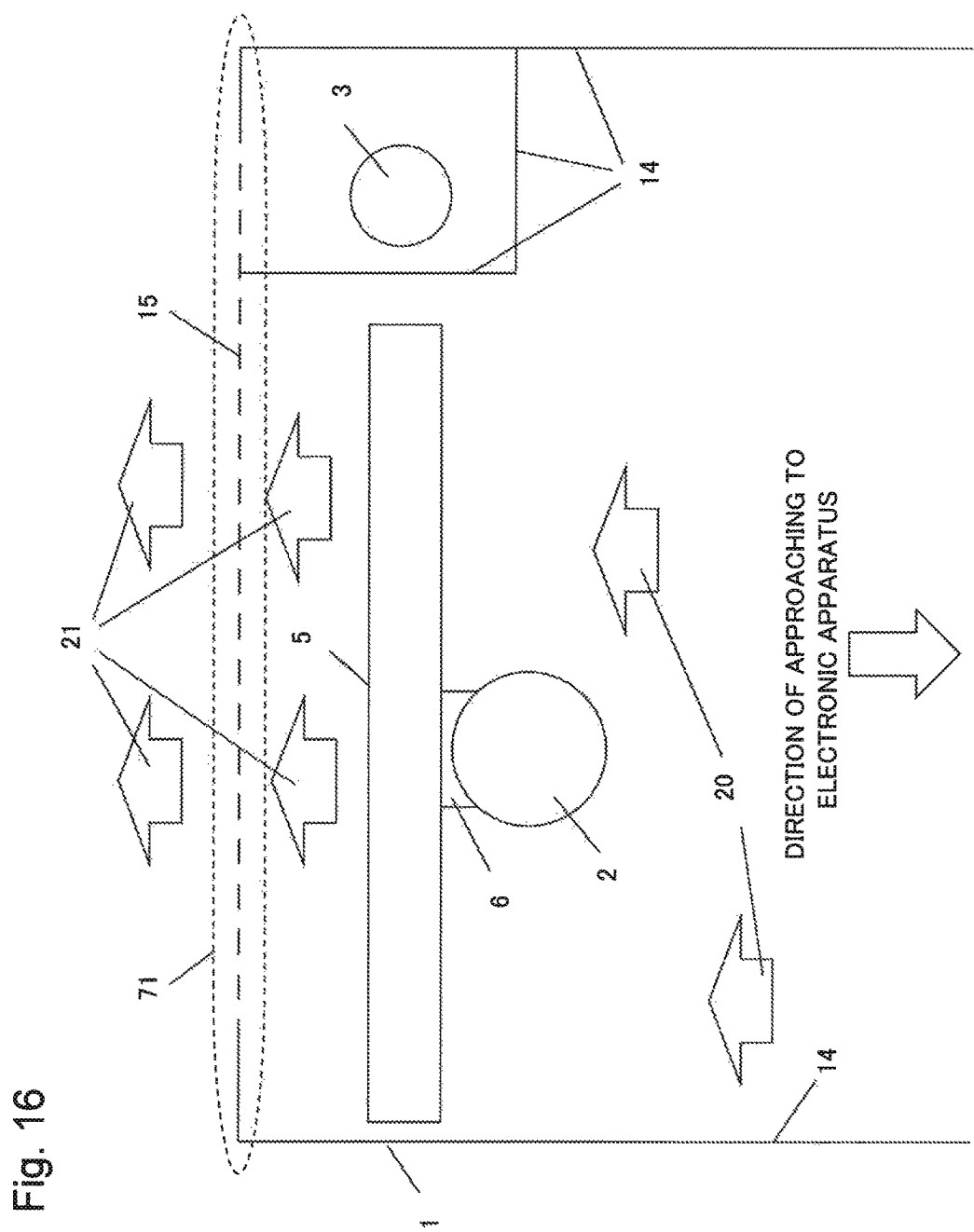
FIG. 16 shows a conceptual cross-sectional view of the first cooling system according to the fifth example embodiment.

FIG. 15 and FIG. 16 show a conceptual view of a first cooling system according to the fifth example embodiment. The number of the heat receiving means 5 can be arbitrarily determined. A case in which the number of the heat receiving means 5 is four will be described here. FIG. 16 shows a conceptual cross-sectional view of the first cooling system according to the fifth example embodiment along a dotted line indicating a sixth cutting position 44 in FIG. 15.

The first cooling system according to the fifth example embodiment includes the chassis 1, four heat receiving means 5, four gas phase pipe branches 6, the gas phase pipe 2, the gas phase pipeline 8, the heat radiation means 10, the liquid phase pipeline 9, the liquid phase pipe 3, and four liquid phase pipe branches 7. The function of each component of this cooling system is almost the same as that of the second cooling system according to the second example embodiment. Therefore, explanation of the same component is omitted and only different point will be described.

The first cooling system according to the fifth example embodiment is characterized in that as shown in FIG. 15 and FIG. 16, the gas phase pipe 2 is disposed at the electronic apparatus side of the heat receiving means 5 so that the gas phase pipe 2 is disposed near the center of each of four heat receiving means 5. As a result, after the exhaust heat flow 20 collides with the gas phase pipe 2, the exhaust heat flow 20 passes through the heat receiving means 5 and is sent to the outside of the chassis 1 as the cooling flow 21. This means that with respect to the flow of the exhaust heat flow 20, the gas phase pipe 2 is located at the upstream side of the heat receiving means 5. Almost all the exhaust heat flow which warms the gas phase pipe 2 passes through the heat receiving means 5. Therefore, the exhaust heat flow 20 can be more efficiently cooled in comparison with a case in which the structure described in the second example embodiment or the third example embodiment is used.

Figure 17:
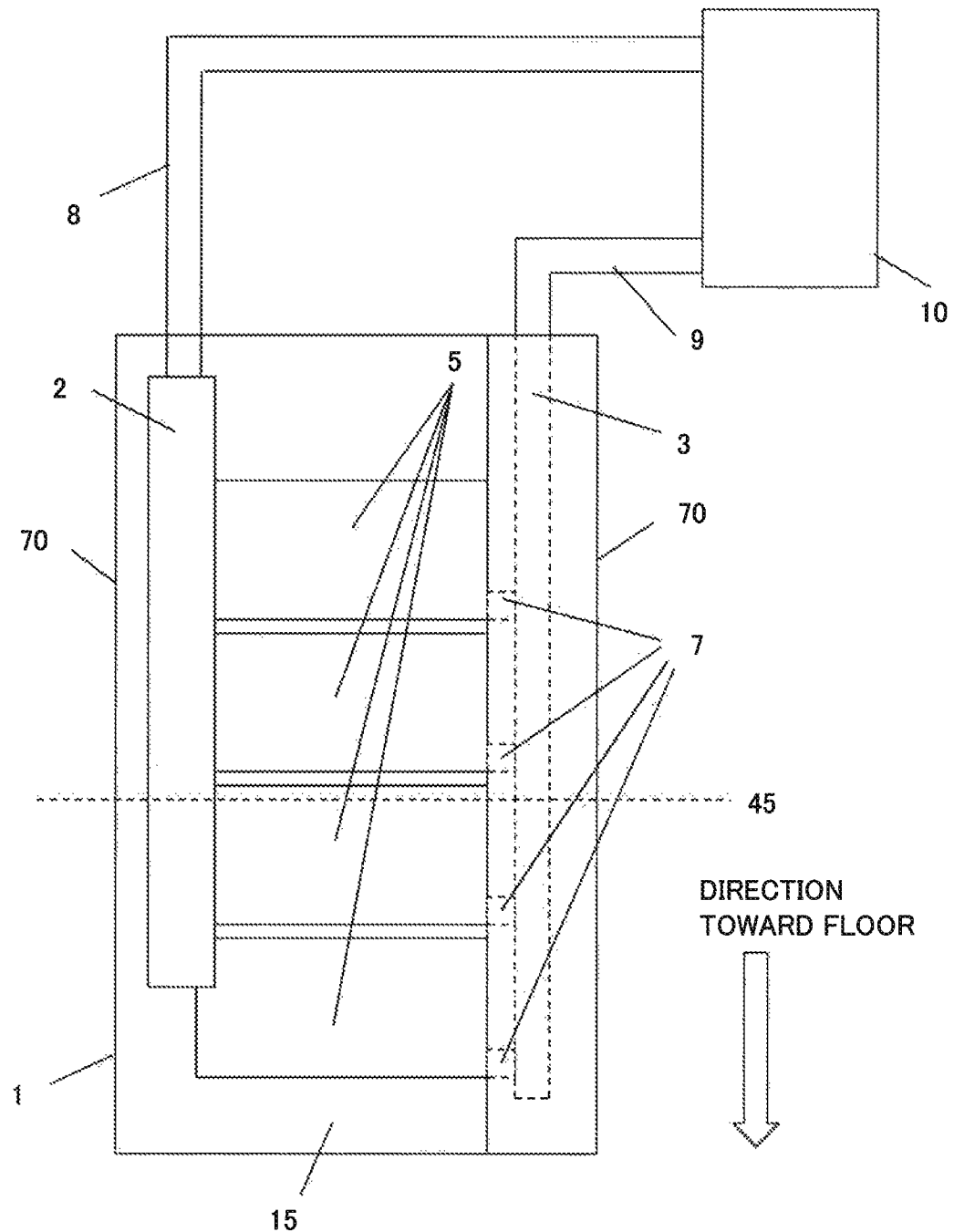
FIG. 17 shows a conceptual view of a second cooling system according to the fifth example embodiment.
Figure 18:
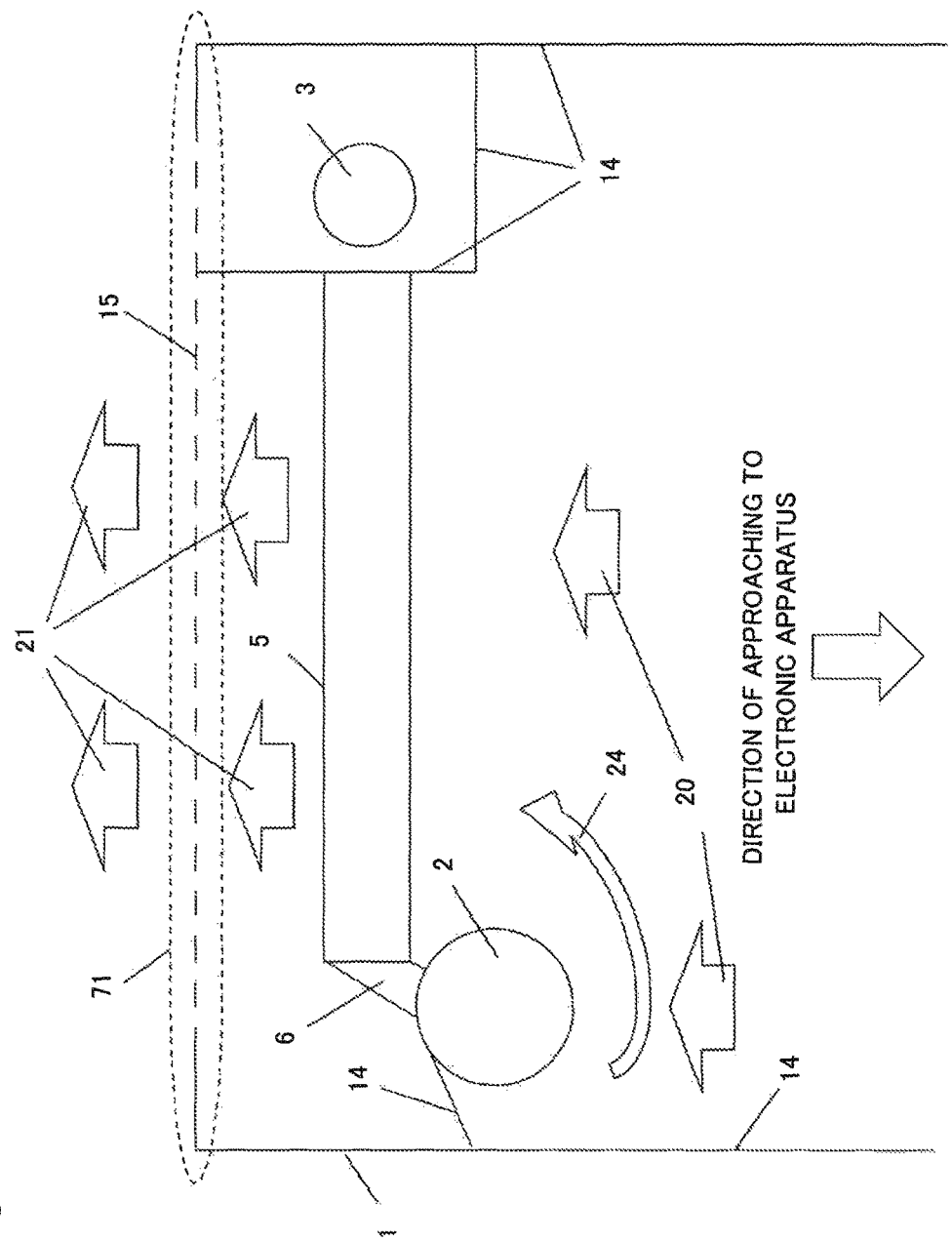
FIG. 18 shows a conceptual cross-sectional view of the second cooling system according to a fifth example embodiment.

FIG. 17 and FIG. 18 show a conceptual view of a second cooling system according to the fifth example embodiment. The number of the heat receiving means 5 can be arbitrarily determined. A case in which the number of the heat receiving means 5 is four will be described here. FIG. 18 shows a conceptual cross-sectional view of the second cooling system according to the fifth example embodiment along a dotted line indicating a seventh cutting position 45 in FIG. 17.

The second cooling system according to the fifth example embodiment includes the chassis 1, four heat receiving means 5, four gas phase pipe branches 6, the gas phase pipe 2, the gas phase pipeline 8, the heat radiation means 10, the liquid phase pipeline 9, the liquid phase pipe 3, and four liquid phase pipe branches 7. The function of each component of this cooling system is almost the same as that of the second cooling system according to the second example embodiment. Therefore, explanation of the same component is omitted and only different point will be described.

The second cooling system according to the fifth example embodiment is characterized in that as shown in FIG. 17 and FIG. 18, the gas phase pipe 2 is disposed at the electronic apparatus side of the heat receiving means 5. This is the same as the cooling system according to the fourth example embodiment. However, in the fifth example embodiment, the gas phase pipe 2 is disposed near the chassis side face 70 and the non-ventilation wall 14 is disposed in a chassis rear face 71 side of the gas phase pipe 2. This is a difference between the second cooling system according to the fifth example embodiment and the cooling system according to the fourth example embodiment. The exhaust heat flow 20 which collides with the gas phase pipe 2 passes through the heat receiving means by this non-ventilation wall 14 without flowing in the chassis rear face 71 direction as the exhaust heat flow 24 which collides with the gas phase pipe and is sent to the outside of the chassis 1 as the cooling flow 21. This means that with respect to the flow of the exhaust heat flow 20, the gas phase pipe 2 is located at the upstream side of the heat receiving means 5. Almost all the exhaust heat flow which warms the gas phase pipe 2 passes through the heat receiving means 5. Therefore, the exhaust heat flow 20 can be more efficiently cooled in comparison with a case in which the structure described in the second example embodiment or the third example embodiment is used.

Figure 19:
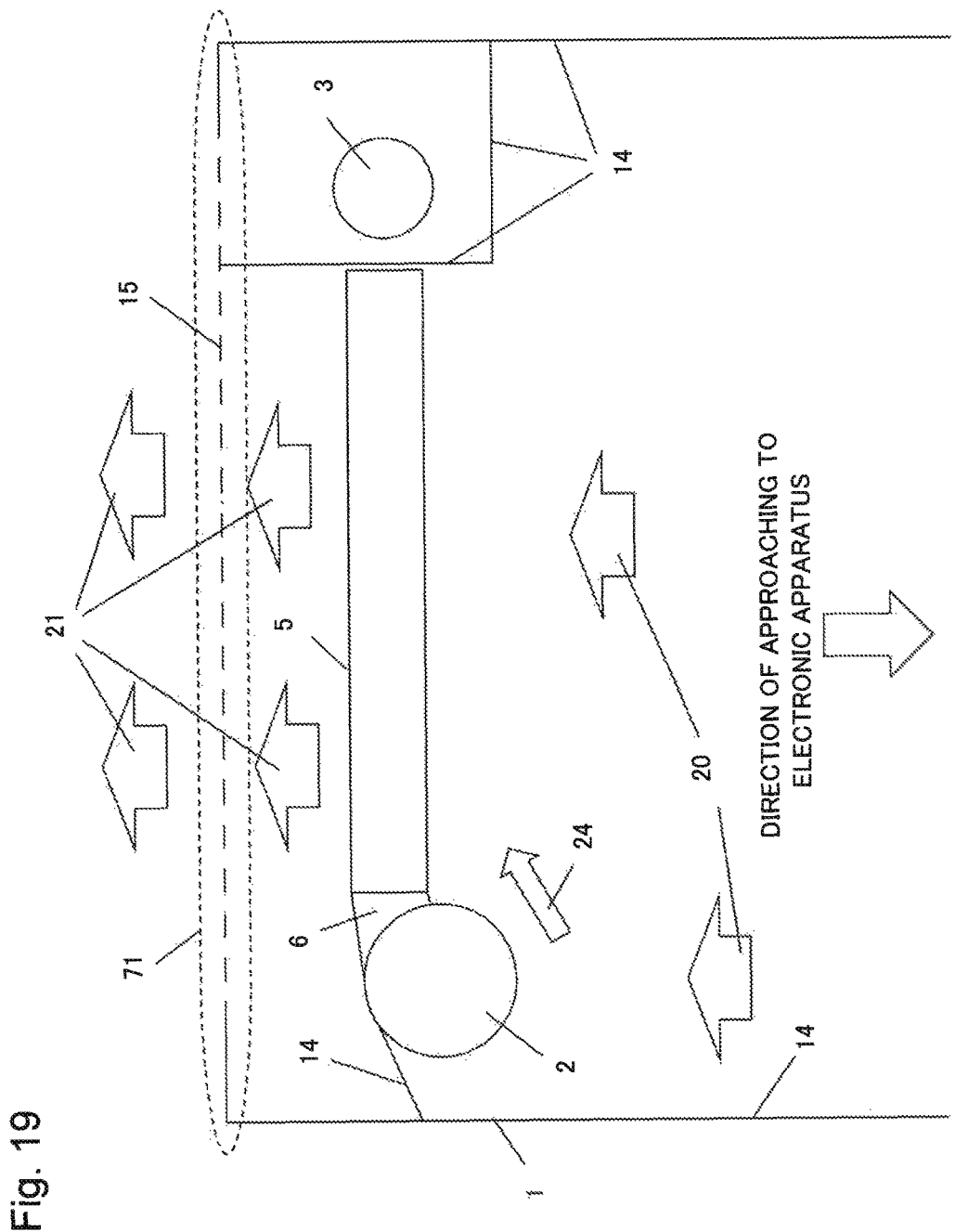
FIG. 19 shows a conceptual cross-sectional view of a variation of a second cooling system according to a fifth example embodiment.

FIG. 19 shows a conceptual cross-sectional view of a variation of the second cooling system according to the fifth example embodiment. In FIG. 19, the gas phase pipe branches 6 are arranged in a linear manner. This is an only difference between the structure shown in FIG. 18 and the structure shown in FIG. 19. The second cooling system shown in FIG. 19 has advantages and the like that are almost the same as those of the second cooling system shown in FIG. 18. However, the second cooling system shown in FIG. 19 has a feature in which because the gas phase pipe branches 6 are arranged in a linear manner, it can be easily manufactured.

Figure 20:
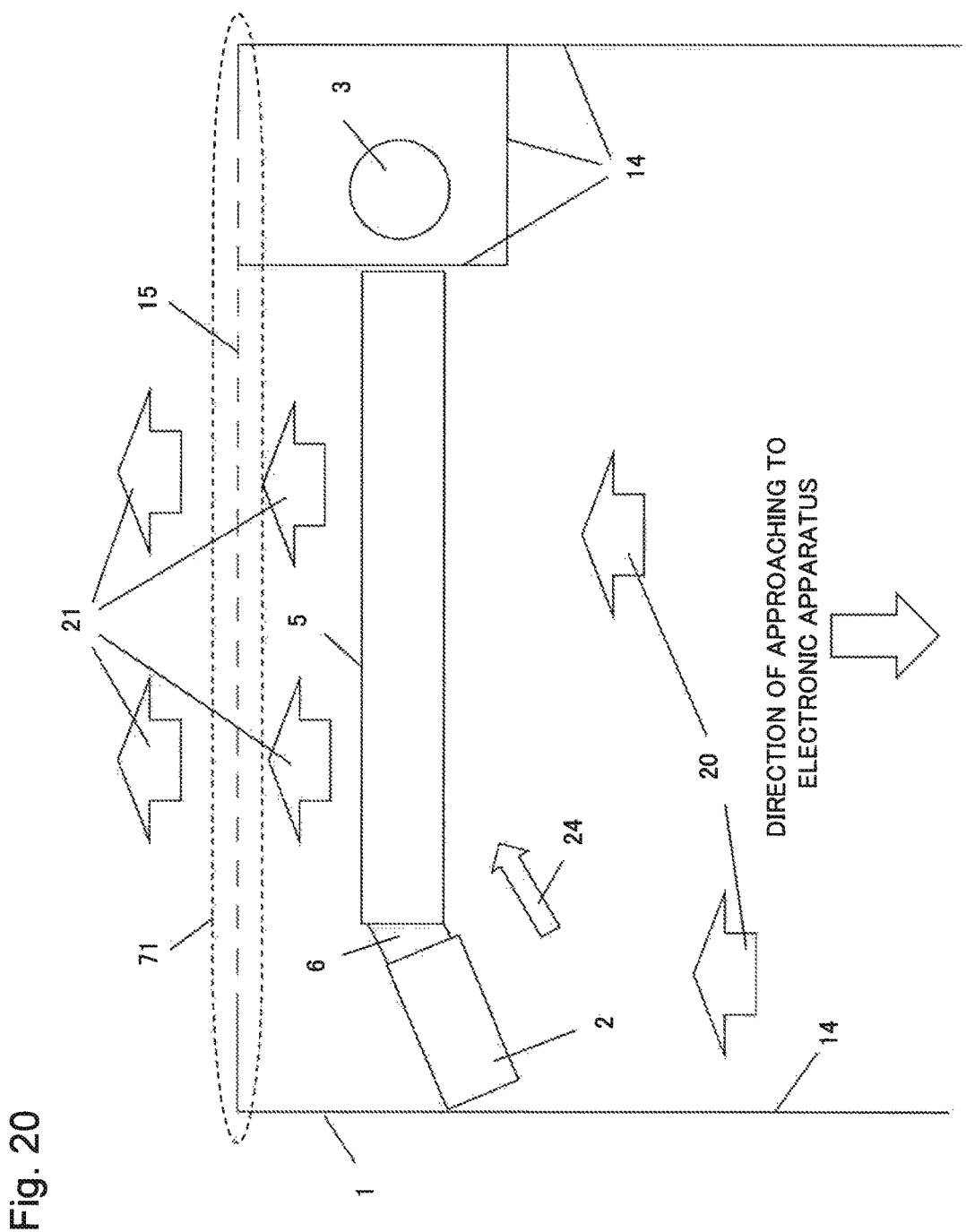
FIG. 20 shows a conceptual cross-sectional view of another variation of a second cooling system according to the fifth example embodiment.

FIG. 20 shows a conceptual cross-sectional view of another variation of the second cooling system according to the fifth example embodiment. In this variation of the second cooling system, the cross-sectional shape of the gas phase pipe 2 is square. This is a difference between the structure shown in FIGS. 18 and 19 and the structure shown in FIG. 20. Therefore, the second cooling system shown in FIG. 20 has an advantage in which after the exhaust heat flow 20 collides with the gas phase pipe 2, the exhaust heat flow 24 that collides with the gas phase pipe can smoothly flow into the heat receiving means 5. Accordingly, when the gas phase pipe 2 is sufficiently warmed by the exhaust heat flow 20, the cooling efficiency of the exhaust heat flow 20 is improved in comparison with a case in which the cross-sectional shape of the gas phase pipe 2 is circular.

Figure 21:
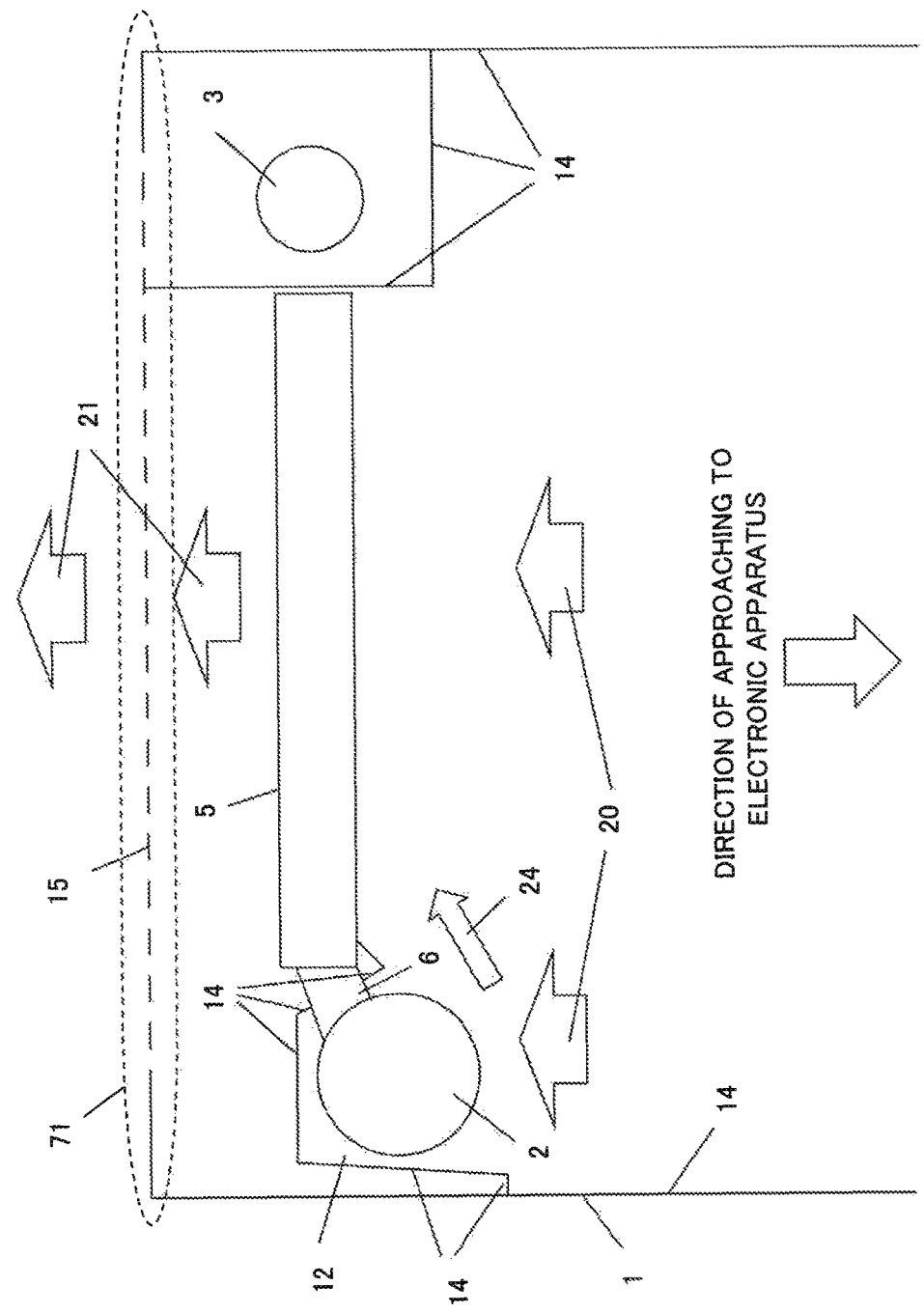
FIG. 21 shows a conceptual cross-sectional view of a third cooling system according to the fifth example embodiment.

FIG. 21 shows a conceptual cross-sectional view of a third cooling system according to the fifth example embodiment. Because a conceptual plan view corresponding to the conceptual cross-sectional view of the third cooling system according to the fifth example embodiment is almost the same as that of the second cooling system according to the fifth example embodiment shown in FIG. 17, it is not shown here. Further, explanation of the structure and function of each component of this cooling system is omitted when it has already been described above and only the different point will be described.

The third cooling system according to the fifth example embodiment is characterized in that the gas phase pipe 2 is disposed at the electronic apparatus side of the heat receiving means 5 and the duct 12 is formed around the gas phase pipe 2 except for the opening. The exhaust heat flow 20 which collides with the gas phase pipe 2 passes through the heat receiving means by the non-ventilation wall 14 of which this duct 12 is composed without flowing in the chassis rear face 71 direction as the exhaust heat flow 24 which collides with the gas phase pipe and is sent to the outside of the chassis 1 as the cooling flow 21. This means that with respect to the flow of the exhaust heat flow 20, the gas phase pipe 2 is located at the upstream side of the heat receiving means 5. Almost all the exhaust heat flow which warms the gas phase pipe 2 passes through the heat receiving means 5. Therefore, the exhaust heat flow 20 can be more efficiently cooled in comparison with a case in which the structure described in the second example embodiment or the third example embodiment is used.

The third cooling system according to the fifth example embodiment has a feature in which because the duct is disposed, the exhaust heat flow 20 can collide with the surrounding part of the gas phase pipe 2 almost uniformly and whereby, the gas phase pipe 2 can be effectively warmed by the exhaust heat flow 20.

The present invention is not limited to the above-mentioned example embodiments and various changes in the configuration described in claims can be made and the example embodiments to which various changes and modifications are applied are also included in the technical scope of the present invention.

The whole or part of the example embodiments disclosed above can be described as, but not limited to, the following supplementary notes.

(Supplementary Note 1)

A cooling system comprising heat receiving means for receiving a gas warmed by heat generated by an electronic apparatus and changing a liquid phase heat medium into a gas phase heat medium, heat radiation means for cooling the gas phase heat medium and thereby, changing the gas phase heat medium into the liquid phase heat medium, first transfer means for transferring the gas phase heat medium from the heat receiving means to the heat radiation means, and second transfer means for transferring the liquid phase heat medium from the heat radiation means to the heat receiving means, wherein at least a part of the first transfer means is heated by using the heat generated by the electronic apparatus.

(Supplementary Note 2)

The cooling system described in Supplementary note 1 in which the gas collides with at least a part of the first transfer means.

(Supplementary Note 3)

The cooling system described in Supplementary note 2 further comprising heat adjustment means for adjusting an amount of the gas which collides with at least a part of the first transfer means.

(Supplementary Note 4)

The cooling system described in Supplementary note 3 in which with respect to a flow of the gas, a wall through which the gas hardly passes is disposed at the downstream side of the first transfer means.

(Supplementary Note 5)

The cooling system described in Supplementary note 3 in which with respect to a flow of the gas, a wall through which the gas hardly passes is disposed around the first transfer means except for a part of the upstream side of the first transfer means.

(Supplementary Note 6)

The cooling system described in any one of Supplementary notes 3 to 5 in which with respect to a flow of the gas from the electronic apparatus to the first transfer means, air guide means which guide the gas is disposed at the upstream side of the first transfer means.

(Supplementary Note 7)

The cooling system described in any one of Supplementary notes 1 to 6 in which with respect to a flow of the gas, the first transfer means is disposed at the upstream side of the heat receiving means.

(Supplementary Note 8)

The cooling system described in any one of Supplementary notes 1 to 7 in which the first transfer means center is disposed between the heat receiving means center and the position at which the electronic apparatus is located.

(Supplementary Note 9)

The cooling system described in any one of Supplementary notes 1 to 8 in which the cooling system includes blowing means for sending gas from the electronic apparatus to the heat receiving means and the first transfer means.

(Supplementary Note 10)

The cooling system described in any one of Supplementary notes 1 to 9 in which the cooling system further comprises the heat medium.

(Supplementary Note 11)

The cooling system described in any one of Supplementary notes 1 to 10 in which the cooling system further comprises a chassis in which the heat receiving means, a part of the first transfer means, and a part of the second transfer means are installed.

(Supplementary Note 12)

The cooling system described in any one of Supplementary notes 1 to 11 in which the cooling system further comprises a chassis door on which the heat receiving means, a part of the first transfer means, and a part of the second transfer means are mounted.

(Supplementary Note 13)

An electronic device in which the cooling system described in Supplementary note 11 and the electronic apparatus are installed in the same chassis.

(Supplementary Note 14)

The electronic device described in Supplementary note 13 in which the blowing means is installed in the chassis.

(Supplementary Note 15)

The electronic device described in Supplementary note 13 in which the blowing means is disposed outside the chassis.

(Supplementary Note 16)

The cooling system described in Supplementary note 6 or Supplementary note 7 in which the cross-sectional shape of a part of the first transfer means with which the gas collides is square.

(Supplementary Note 17)

The cooling system described in any one of Supplementary notes 6, 7, and 16 in which the first transfer means include a gas phase pipe branch disposed at a joint part connected with the heat receiving means and the cross-sectional shape of the gas phase pipe branch is not winding.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2014-212153, filed on Oct. 17, 2014, the disclosure of which is incorporated herein in its entirety by reference.

REFERENCE SIGNS LIST 1 chassis
2 gas phase pipe
3 liquid phase pipe
5 heat receiving means
6 gas phase pipe branch
7 liquid phase pipe branch
8 gas phase pipeline
9 liquid phase pipeline
10 heat radiation means
11 gasification unit
12 duct
13 air guide member
14 non-ventilation wall
15 ventilation wall
16 inlet of heat receiving means
17 outlet of heat receiving means
18 gasification unit's branch
20 exhaust heat flow
21 cooling flow
22 non-cooling flow
23 suction flow
24 exhaust heat flow that collides with gas phase pipe
39 first cutting position
40 second cutting position
41 third cutting position
42 fourth cutting position
43 fifth cutting position
44 sixth cutting position
45 seventh cutting position
50 cooling system
52 cooling system in which component and chassis door are integrated
60 first transfer means
61 second transfer means
70 chassis side face
71 chassis rear face
72 non-ventilation rear face
75 chassis front face
80 chassis door
81 door hinge
212 electronic apparatus
213 fan
220 air conditioner's airflow

What is claimed is:

1. A cooling system comprising:
a heat receiver for receiving a gas warmed by heat generated by an electronic apparatus and changing a liquid phase heat medium into a gas phase heat medium,
a heat radiator for cooling the gas phase heat medium and thereby, changing the gas phase heat medium into the liquid phase heat medium,
a first pipe for transferring the gas phase heat medium from the heat receiver to the heat radiator, and
a second pipe for transferring the liquid phase heat medium from the heat radiator to the heat receiver,
wherein at least a part of the first pipe is heated by using the heat generated by the electronic apparatus,
wherein, with respect to a flow of the gas, a first wall through which the gas hardly passes is disposed around the first pipe except for the part of the first pipe, the part of the first pipe being at an upstream side of the first pipe at which the flow of the gas reaches earlier than at a downstream side of the first pipe, and
wherein a second wall is disposed around the second pipe.

2. The cooling system described in claim 1 in which the gas collides with the part of the first pipe.

3. The cooling system described in claim 2 further comprising a heat adjuster for adjusting an amount of the gas which collides with the part of the first pipe.

4. The cooling system described in claim 3 in which at least a portion of the first wall is disposed at the downstream side of the first pipe.

5. The cooling system described in claim 3 in which with respect to the flow of the gas from the electronic apparatus to the first pipe, an air guide which guides the gas is disposed at the upstream side of the first pipe.

6. The cooling system described in claim 1 in which the cooling system includes a blower for sending the gas from the electronic apparatus to the heat receiver and the first pipe.

7. The cooling system described in claim 1 in which the cooling system further comprises a heat medium, the heat medium comprises the liquid phase heat medium and the gas phase heat medium.

8. The cooling system described in claim 1 in which the cooling system further comprises a chassis in which the heat receiver, a portion of the first pipe, and a part of the second pipe are installed.

9. The cooling system described in claim 1 in which the cooling system further comprises a chassis door on which the heat receiver, a portion of the first pipe, and a part of the second pipe are mounted.

10. The cooling system according to claim 1, wherein the heat receiver is extended between the first wall and the second wall,
   a part of the first wall is interposed between the part of the first pipe and a first end of the heat receiver, and
   a part of the second wall is interposed between the second pipe and a second end of the heat receiver, opposite to the first end of the heat receiver.

* * * * *